US009799687B2

(12) United States Patent
Abe

(10) Patent No.: US 9,799,687 B2
(45) Date of Patent: Oct. 24, 2017

(54) METHOD FOR MANUFACTURING ACTIVE-MATRIX DISPLAY PANEL, AND ACTIVE-MATRIX DISPLAY PANEL

(71) Applicant: JOLED INC., Tokyo (JP)

(72) Inventor: Yuuki Abe, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/320,315

(22) PCT Filed: Jun. 10, 2015

(86) PCT No.: PCT/JP2015/002895
§ 371 (c)(1),
(2) Date: Dec. 19, 2016

(87) PCT Pub. No.: WO2015/194128
PCT Pub. Date: Dec. 23, 2015

(65) Prior Publication Data
US 2017/0162607 A1   Jun. 8, 2017

(30) Foreign Application Priority Data

Jun. 19, 2014 (JP) .................................. 2014-126381

(51) Int. Cl.
*H01L 27/12* (2006.01)
*H01L 21/02* (2006.01)
(Continued)

(52) U.S. Cl.
CPC .... *H01L 27/1259* (2013.01); *H01L 21/02052* (2013.01); *H01L 21/02063* (2013.01);
(Continued)

(58) Field of Classification Search
None
See application file for complete search history.

(56) References Cited

U.S. PATENT DOCUMENTS 5,443,922 A    8/1995 Nishizaki et al.
2002/0104995 A1* 8/2002 Yamazaki ........... H01L 27/3246
257/72
(Continued)

FOREIGN PATENT DOCUMENTS

JP    5-163488 A    6/1993
JP    2002-98994 A    4/2002
(Continued)

OTHER PUBLICATIONS

International Search Report in International Patent Application No. PCT/JP2015/002895, dated Sep. 1, 2015.

*Primary Examiner* — Minh-Loan Tran
(74) *Attorney, Agent, or Firm* — Hauptman Ham, LLP

(57) ABSTRACT

Manufacturing method including forming, over substrate, TFT layer, planarization layer, and display element in this order. Forming of TFT layer involves forming passivation layer to cover TFT layer electrode, such as upper electrode, and to come in contact with planarizing layer. Forming of display element involves forming bottom electrode to come in contact with planarizing layer. TFT layer electrode and bottom electrode are connected by: first forming, in planarizing layer, first contact hole exposing passivation layer at bottom thereof; then forming second contact hole exposing TFT layer electrode at bottom thereof through dry-etching passivation layer exposed at bottom of first contact hole using fluorine-containing gas; then forming liquid repellent film containing fluorine on passivation layer inner surface facing second contact hole; and forming bottom electrode along planarizing layer inner surface and passivation layer inner surface respectively facing first contact hole and second contact hole.

8 Claims, 14 Drawing Sheets

(51) Int. Cl.
*H01L 21/311* (2006.01)
*H05B 33/08* (2006.01)
*H01L 27/32* (2006.01)
*G02F 1/1368* (2006.01)
*G02F 1/1362* (2006.01)

(52) U.S. Cl.
CPC .. *H01L 21/31116* (2013.01); *H01L 21/31138* (2013.01); *H01L 27/1248* (2013.01); *H01L 27/3244* (2013.01); *H01L 27/3246* (2013.01); *H01L 27/3251* (2013.01); *H01L 27/3258* (2013.01); *H05B 33/0896* (2013.01); *G02F 1/1368* (2013.01); *G02F 1/136227* (2013.01); *H01L 27/3248* (2013.01); *H01L 2227/323* (2013.01)

(56) References Cited

U.S. PATENT DOCUMENTS

| | | |
|---|---|---|
| 2002/0190253 A1 | 12/2002 | Tsujimura et al. |
| 2003/0197180 A1 | 10/2003 | Tsujimura et al. |
| 2004/0246424 A1 | 12/2004 | Sawasaki et al. |
| 2005/0214688 A1 | 9/2005 | Yamamoto et al. |
| 2006/0114393 A1 | 6/2006 | Sawasaki et al. |
| 2008/0012022 A1 | 1/2008 | Moriwaki |
| 2011/0157526 A1 | 6/2011 | Shibata et al. |
| 2015/0001517 A1 | 1/2015 | Abe et al. |
| 2016/0133650 A1* | 5/2016 | Sugawara ........... H01L 29/7869 257/40 |

FOREIGN PATENT DOCUMENTS

| | | |
|---|---|---|
| JP | 2002-250934 A | 9/2002 |
| JP | 2004-318063 A | 11/2004 |
| JP | 2004-363034 A | 12/2004 |
| JP | 2005-328037 A | 11/2005 |
| JP | 2007-95515 | 4/2007 |
| JP | 2008-20572 A | 1/2008 |
| JP | 2008-198491 | 8/2008 |
| WO | 2010/024035 A1 | 3/2010 |
| WO | 2013/108598 A1 | 7/2013 |

* cited by examiner

FIG. 1
(a)
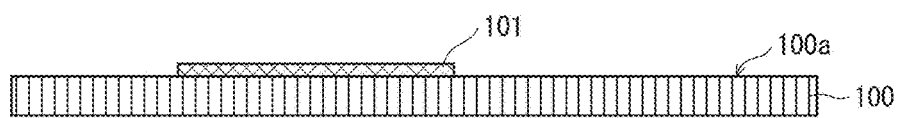
(b)
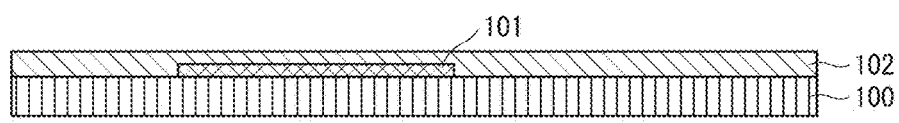
(c)
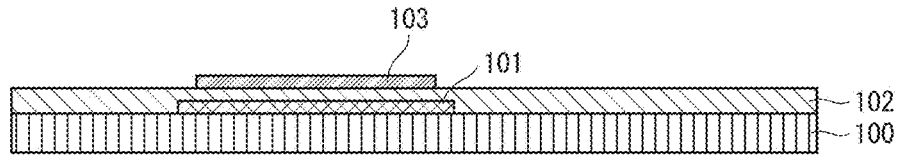
(d)
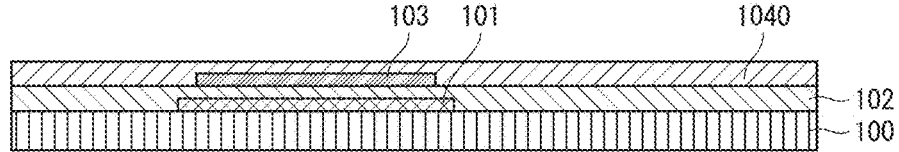
(e)
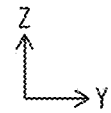

FIG. 2
(a)
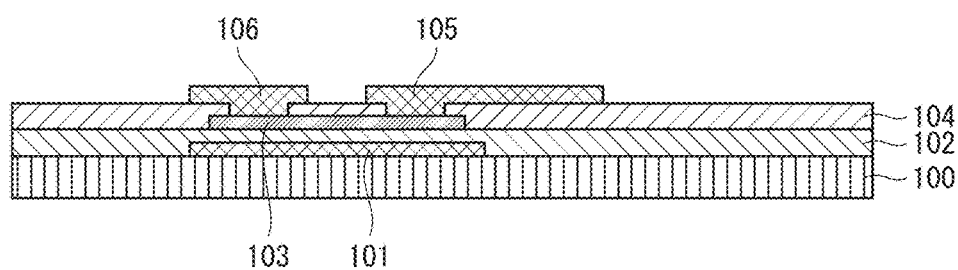
(b)
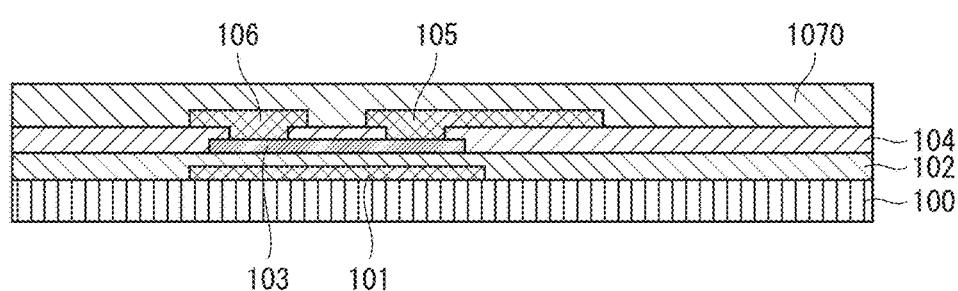
(c)
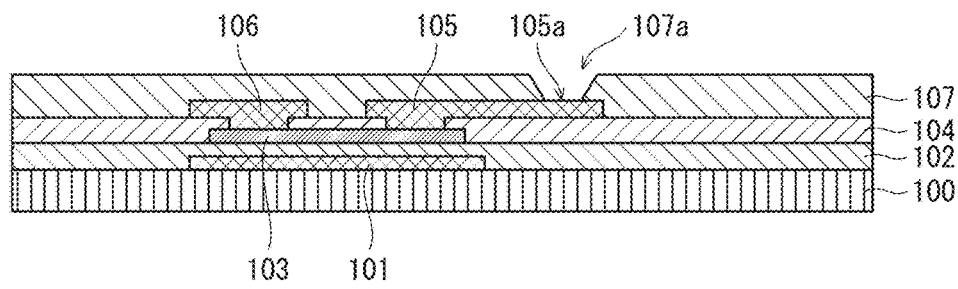
(d)
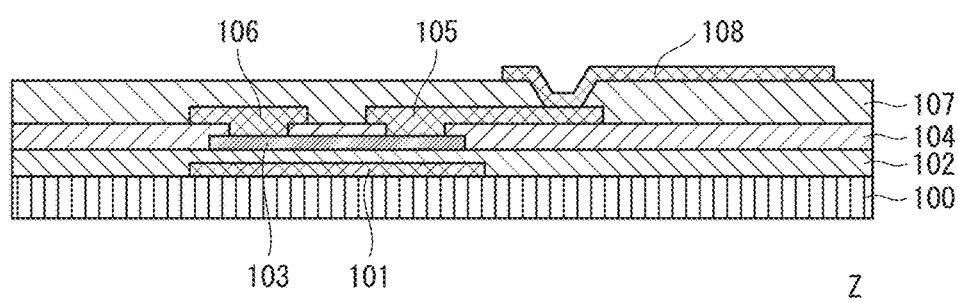

FIG. 3
(a)
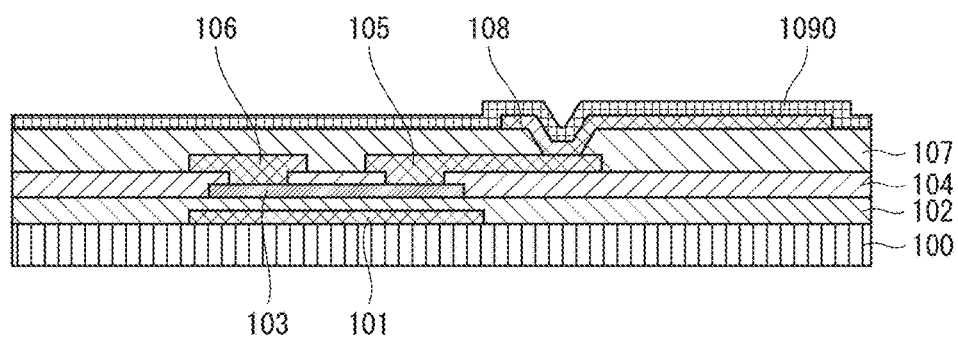
(b)
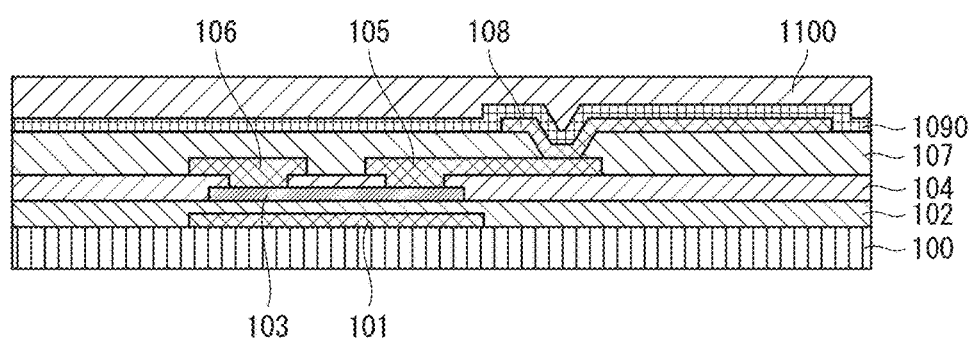
(c)
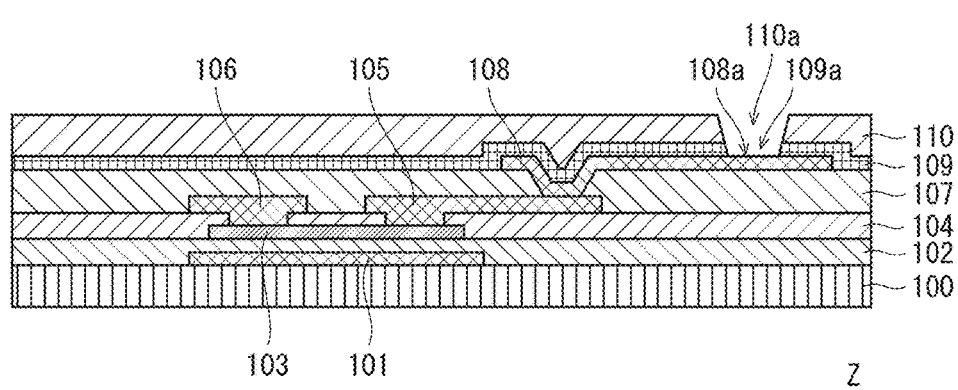

FIG. 4
(a)
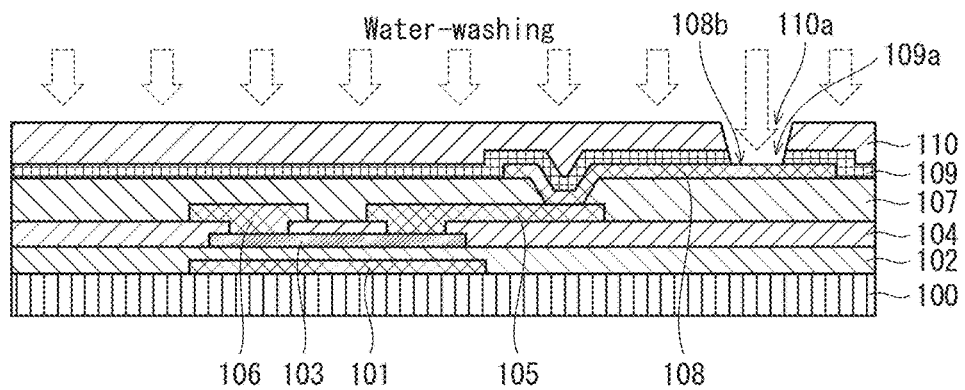
(b)
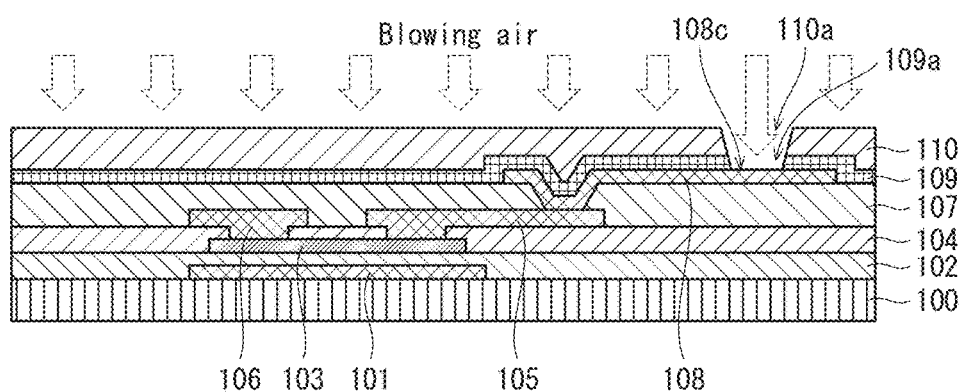
(c)
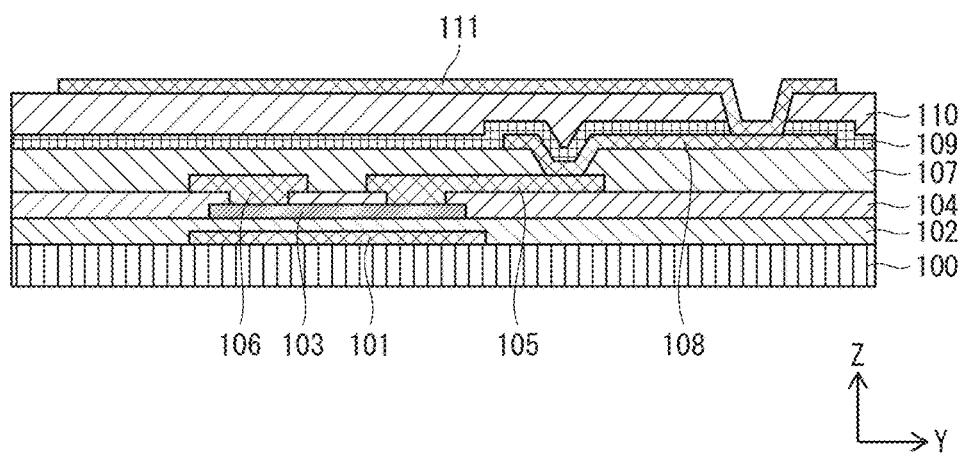

FIG. 5
(a)
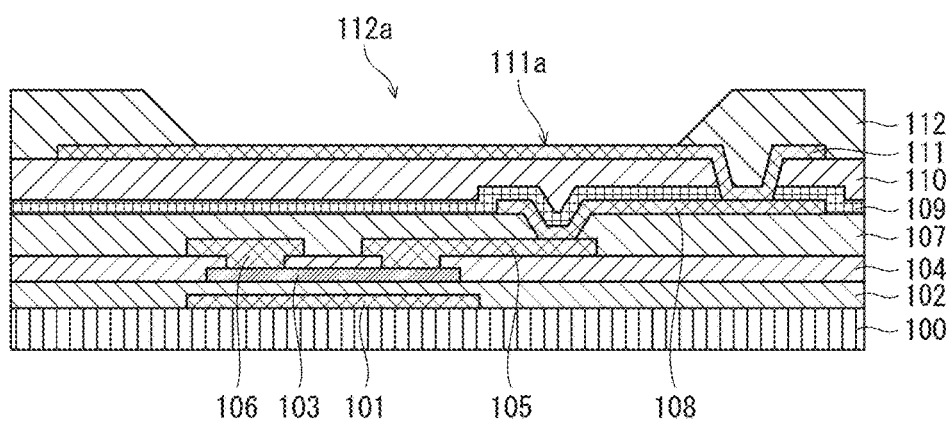
(b)
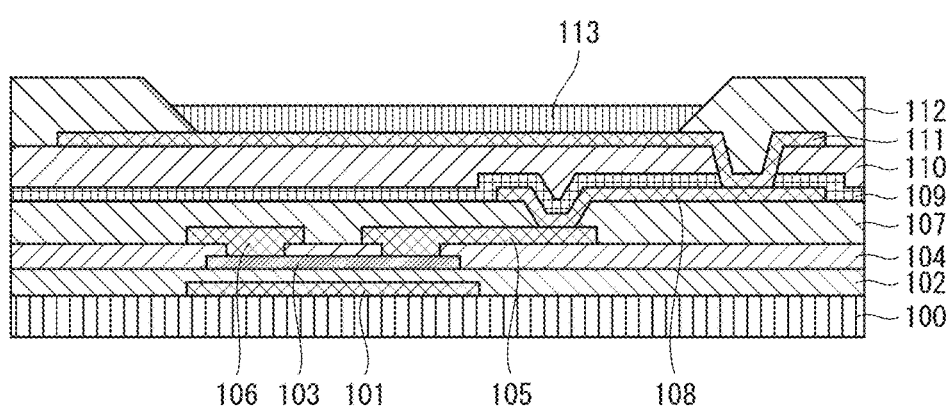
(c)
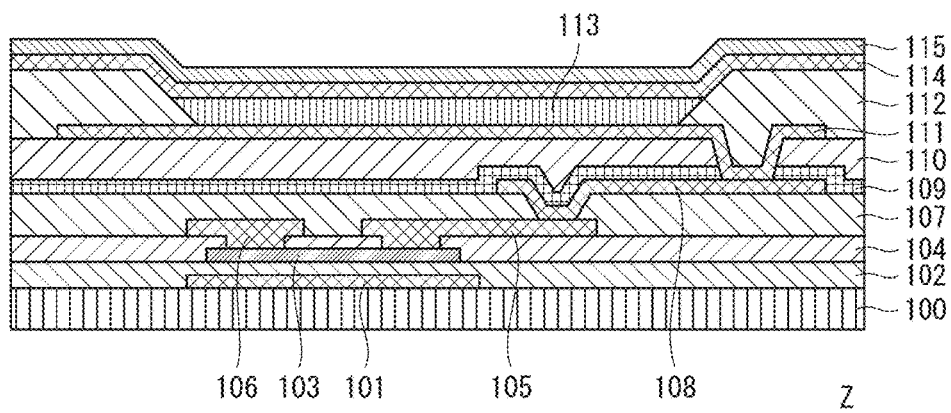

FIG. 8
(a)
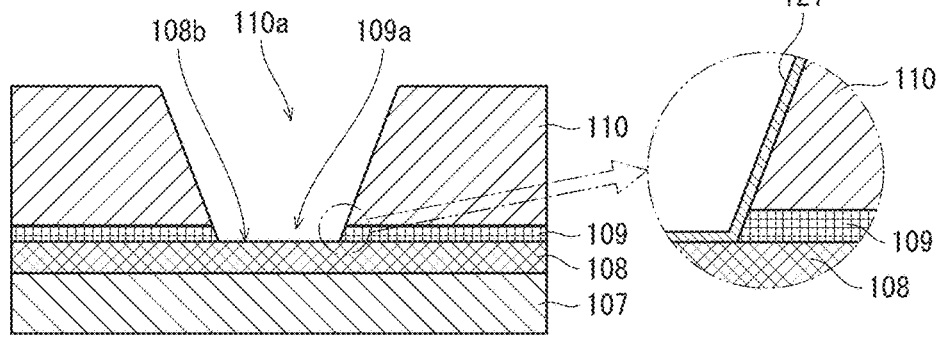
(b)
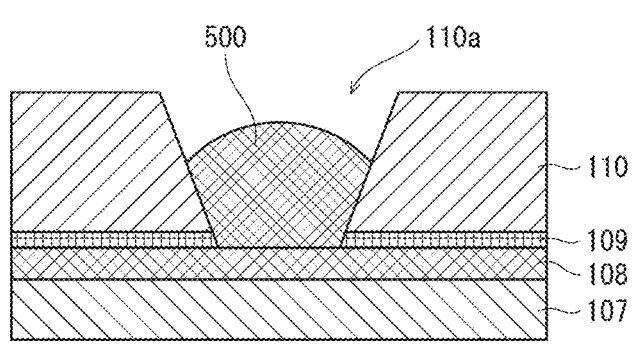
(c)
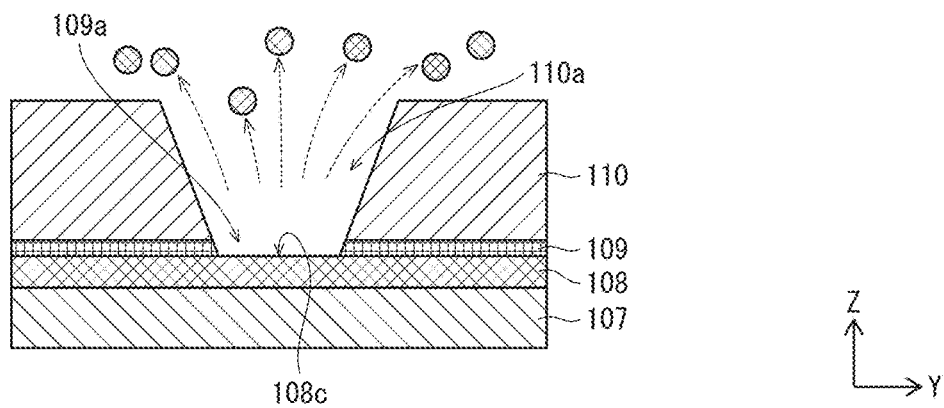

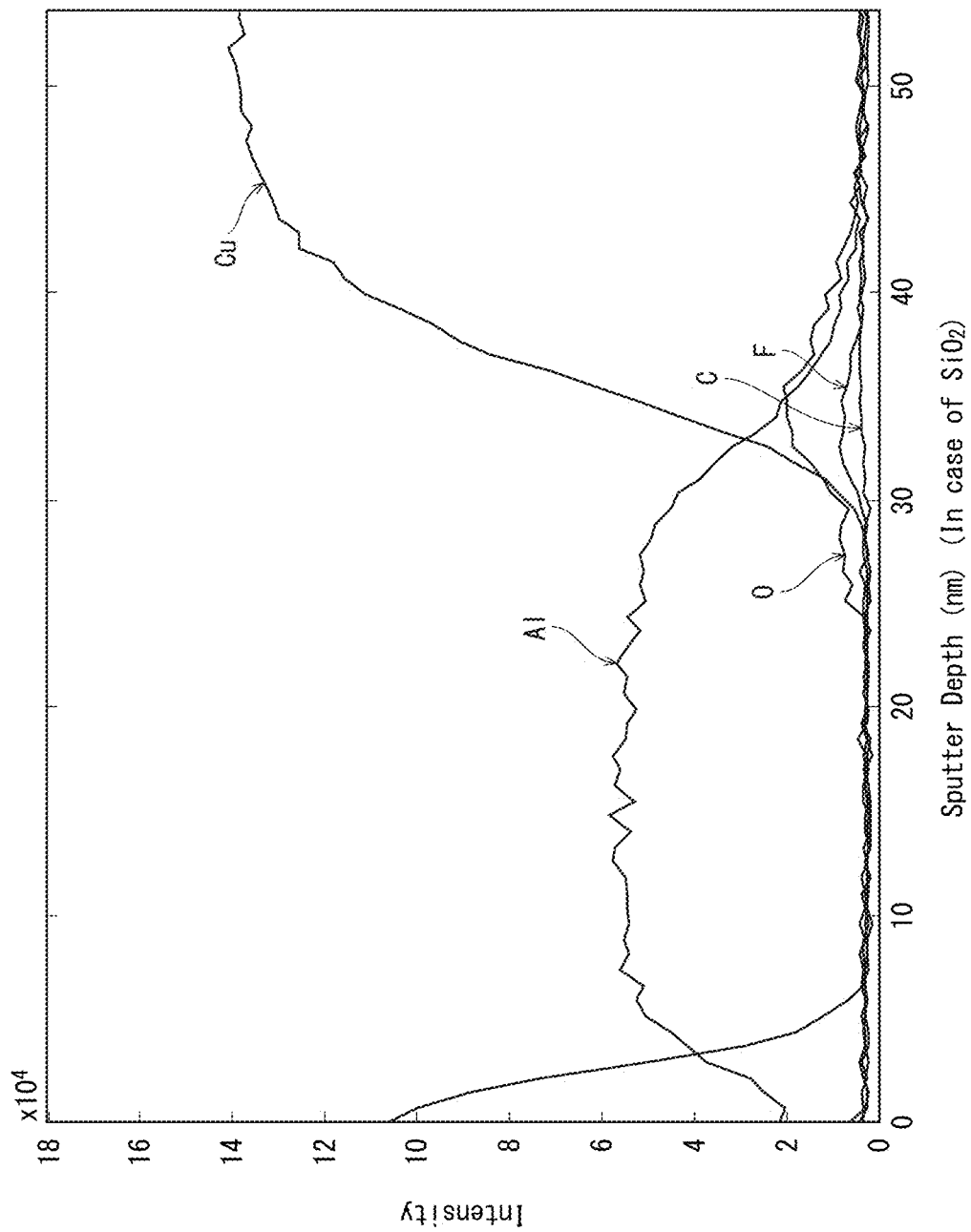

METHOD FOR MANUFACTURING ACTIVE-MATRIX DISPLAY PANEL, AND ACTIVE-MATRIX DISPLAY PANEL

RELATED APPLICATIONS

The present application is a National Phase of International Application Number PCT/JP2015/002895, filed on Jun. 10, 2015, which claims priority to Japanese Patent Application Number 2014-126381, filed on Jun. 19, 2014.

TECHNICAL FIELD

The present invention relates to a method of manufacturing an active-matrix display panel, and an active-matrix display panel, and in particular to a technology pertaining to forming of contact holes in two electrically-insulating layers disposed between an electrode of a thin film transistor (TFT) layer and an electrode of a display element unit in order to assure a connection between these two electrodes.

BACKGROUND ART

In recent years, liquid crystal display panels are widely used. Further, developments are made so as to achieve practical use of organic electroluminescence (EL) display panels. These display panels are often active-matrix display panels in which each pixel is driven and controlled by a TFT each formed below a light-emitting unit (Patent Literature 1, 2, and 3). As an example, the following describes an overview of a method of manufacturing an organic EL display panel, with reference to FIG. 14.

A TFT layer is formed on an upper surface of a substrate 900, as illustrated in FIG. 14. The TFT layer has a gate electrode 901, a gate insulating layer 902, a channel layer 903, a channel protection layer 904, a source electrode 905 and a drain electrode 906, an interlayer electrically-insulating layer 907, an upper electrode 908, and a passivation layer 909 that are formed in this order from a side of the TFT layer of the substrate 900.

Next, an organic light-emitting unit (display element unit) is formed above the passivation layer 909 of the TFT layer with a planarizing layer 910 disposed between the organic light-emitting unit and the passivation layer 909. The organic light-emitting unit has an anode 911, banks 912, an organic light-emitting functional layer 913, a cathode 914, and a sealing layer 915 that are disposed in this order from a light-emitting unit side of the passivation layer 909.

Next, a color filter substrate (CF substrate) is formed above the organic light-emitting unit with a resin layer 916 disposed between the CF substrate and the organic light-emitting element. The CF substrate has a color filter layer 917 and a black matrix layer 918 that are formed on a lower surface of a substrate 919.

The upper electrode 908 of the TFT layer is electrically connected to the source electrode 905. The upper electrode 908 is also electrically connected to the anode 911 through contact holes formed in the passivation layer 909 and the planarizing layer 910. The contact holes are formed through the following processes: forming a contact hole in the planarizing layer 910 through lithography; and forming a contact hole in the passivation layer 909 through dry-etching the passivation layer 909 by using the planarizing layer 910, in which a contact hole has been formed, as a mask. The contact hole in the passivation layer 909 connects to the contact hole in the planarizing layer 910.

CITATION LIST

Patent Literature

[Patent Literature 1]
  Japanese Patent Application Publication No. 2004-363034
[Patent Literature 2]
  Japanese Patent Application Publication No. 2007-95515
[Patent Literature 3]
  Japanese Patent Application Publication No. 2008-198491

SUMMARY OF INVENTION

Technical Problem

However, in the display panel manufactured through the conventional manufacturing method, a metal oxide film 922 is sometimes formed between the upper electrode 908 of the TFT layer and the anode 911 at the bottom of a contact hole as illustrated in a partially-magnified portion of FIG. 14 surrounded by a two-dot-dash line. When this metal oxide film 922 is formed, connection failure occurs between the upper electrode 908 and the anode 911, and displaying quality of the display panel is deteriorated.

The present invention has been achieved to resolve the above problem, and an aim thereof is to provide a method of manufacturing an active-matrix display panel in which an excellent connection between an electrode of a TFT layer and an electrode of a display element unit is achieved while forming contact holes in two electrically-insulating layers disposed between these two electrodes, and such an active-matrix display panel.

Solution to Problem

A method of manufacturing an active-matrix display panel pertaining to one aspect of the present invention includes: (i) forming a TFT layer on a substrate; (ii) forming a planarizing layer on the TFT layer; and (iii) forming a display element unit on the planarizing layer.

(i) The forming of the TFT layer includes forming a passivation layer that covers one electrode and that comes into contact with the planarizing layer after forming of the planarizing layer, the one electrode being one of: (a) a source electrode; (b) a drain electrode; and (c) a connection electrode connected to the source electrode or the drain electrode.

(ii) The forming of the display element unit includes forming a lower electrode that is in contact with the planarizing layer and connects to the one electrode.

Connecting the one electrode and the lower electrode involves the following.

(iv-1) In the planarizing layer, a contact hole that exposes the passivation layer at the bottom thereof is formed.

(iv-2) In the passivation layer, a contact hole that connects to the contact hole formed in the planarizing layer and exposes the one electrode at the bottom thereof is formed, through dry-etching the passivation layer exposed at the bottom of the contact hole in the planarizing layer by using a gas containing fluorine.

(iv-3) After forming the contact hole in the passivation layer, a liquid-repellent film containing fluorine is formed on an inner wall surface of the passivation layer facing the contact hole in the passivation layer.

Finally, the lower electrode is formed along an inner wall surface of the planarizing layer facing the contact hole in the planarizing layer and the inner wall surface of the passivation layer facing the contact hole in the passivation layer.

Advantageous Effects of Invention

Additionally, in the manufacturing method pertaining to the above aspect, the contact hole in the passivation layer is formed by using a gas containing fluorine. Accordingly, after forming of the contact hole in the passivation layer in (iv-2) above, a liquid-repellent film containing fluorine is formed at least on the inner wall surface of the planarizing layer facing the contact hole in the planarizing layer. Because liquid-repellent films are formed on the inner wall surfaces of the planarizing layer and the passivation layer facing the contact holes in the planarizing layer and the passivation layer, the inner wall surfaces facing the contact holes and the surface of the one electrode exposed at the bottom of the contact holes are prevented from becoming wet even when moisture enters the contact holes.

The manufacturing method pertaining to the above aspect can effectively prevent forming of an oxide film on the surface of the one electrode exposed at the bottom of the contact holes.

Accordingly, an active-matrix display panel that can achieve an excellent connection between the electrode of the TFT layer and the electrode of the display element unit can be manufactured while forming contact holes in two electrically-insulating layers (the passivation layer and the planarizing layer) disposed between these two electrodes.

BRIEF DESCRIPTION OF DRAWINGS

FIG. 1 includes parts (a)-(e) that are schematic cross-sectional views sequentially illustrating processes of forming a display panel 10 pertaining to an embodiment of the present invention.

FIG. 2 includes parts (a)-(d) that are schematic cross-sectional views sequentially illustrating processes of forming the display panel 10 pertaining to the embodiment of the present invention.

FIG. 3 includes parts (a)-(c) that are schematic cross-sectional views sequentially illustrating processes of forming the display panel 10 pertaining to the embodiment of the present invention.

FIG. 4 includes parts (a)-(c) that are schematic cross-sectional views sequentially illustrating processes of forming the display panel 10 pertaining to the embodiment of the present invention.

FIG. 5 includes parts (a)-(c) that are schematic cross-sectional views sequentially illustrating processes of forming the display panel 10 pertaining to the embodiment of the present invention.

FIG. 8 includes parts (a)-(c) that are schematic cross-sectional views sequentially illustrating processes pertaining to the practical example of forming the contact holes in the passivation layer 1090 and the planarizing layer 1100.

FIG. 11 is a graph illustrating a composition of an upper electrode 108 exposed at the bottom of a contact hole in the passivation layer.

DESCRIPTION OF EMBODIMENTS

[How Aspects of Present Invention were Achieved]

Figure 14:
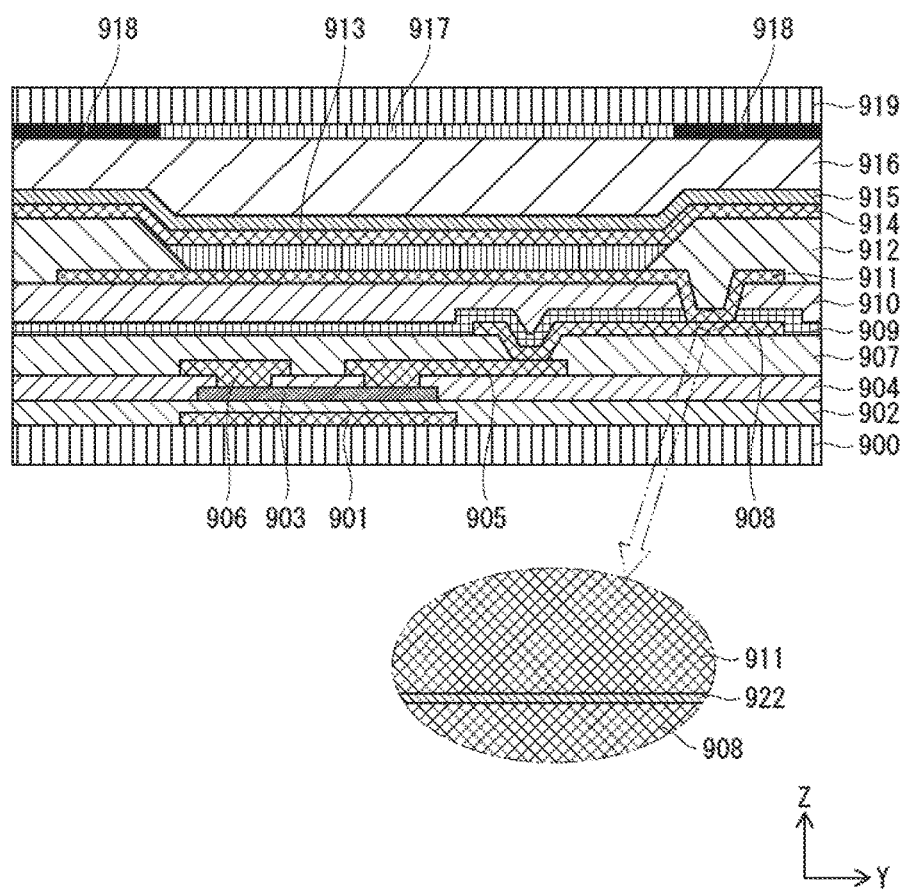
FIG. 14 is a schematic cross-sectional view illustrating a structure of a display panel pertaining to a conventional technology.

The following describes how the present inventor, in cooperation with one or more others, has revealed the mechanism of occurrence of a problem illustrated in the portion of FIG. 14 surrounded by the two-dot-dash line, that is, how the metal oxide film 922 comes to be formed between the upper electrode 908 of the TFT layer and the anode 911 and causes connection failure between the upper electrode 908 and the anode 911.

During forming a display panel, contact holes for contact between the upper electrode 908 and the anode 911 are formed after forming of the TFT layer and the planarizing layer 910. The contact holes are formed through the following processes: forming a contact hole in the planarizing layer 910 through lithography (exposure/development); and forming a contact hole in the passivation layer 909 through dry-etching the passivation layer 909 exposed at the bottom of the contact hole in the planarizing layer 910. After the dry-etching, insides of the contact holes, a surface of the planarizing layer 910, and the like are washed by using, for example, pure water.

After the washing, dry air or the like is used to remove moisture. Here, because the planarizing layer 910 already has a contact hole formed therein and an inner wall surface of the planarizing layer 910 facing the contact hole in the planarizing layer 910 has been exposed to an etching gas containing fluorine during forming of the contact hole in the passivation layer 909, the inner wall surface of the planarizing layer 910 facing the contact hole in the planarizing layer 910 is covered by a fluorine film. However, it is considered that almost no fluorine film has been formed on an inner wall surface of the passivation layer 909 facing the contact hole in the passivation layer 909. This is considered to be due to the following: in the conventional manufacturing method, the inner wall surface of the passivation layer 909 facing the contact hole in the passivation layer 909 is exposed to only a small amount of fluorine because etching is terminated when the contact hole in the passivation layer 909 has been formed and a surface of the upper electrode 908 is exposed at the bottom of the contact hole in the passivation layer 909.

It is considered that water sometimes remains at the bottom of the contact hole in the passivation layer 909 even after blowing dry air when the washing using water is performed under a situation in which almost no fluorine film has been formed on the inner wall surface of the passivation layer 909 facing the contact hole in the passivation layer 909 as described above. The present inventor, in cooperation with one or more others, considered that the metal oxide film 922 is formed on the surface of the upper electrode 908 because the surface of the upper electrode 908 is oxidized by the water remaining at the bottom of the contact hole in the passivation layer 909.

Aspects of Present Invention

A method of manufacturing an active-matrix display panel pertaining to one aspect of the present invention includes: forming a TFT layer on a substrate; forming a planarizing layer on the TFT layer; and forming a display element unit on the planarizing layer.

(i) The forming of the TFT layer includes forming a passivation layer that covers one electrode (hereinafter referred to as the upper electrode or the like) and that comes into contact with the planarizing layer after forming of the planarizing layer, the upper electrode or the like being one of: (a) a source electrode; (b) a drain electrode; and (c) a connection electrode connected to the source electrode or the drain electrode.

(ii) The forming of the display element unit includes forming a lower electrode that is in contact with the planarizing layer and connects to the upper electrode or the like.

Connecting the upper electrode or the like and the lower electrode involves the following.

(iv-1) In the planarizing layer, a contact hole that exposes the passivation layer at the bottom thereof is formed.

(iv-2) In the passivation layer, a contact hole that connects to the contact hole formed in the planarizing layer and exposes the upper electrode or the like at the bottom thereof is formed, through dry-etching the passivation layer exposed at the bottom of the contact hole in the planarizing layer by using a gas containing fluorine.

(iv-3) After forming the contact hole in the passivation layer, a liquid-repellent film containing fluorine is formed on an inner wall surface of the passivation layer facing the contact hole in the passivation layer.

Finally, the lower electrode is formed along an inner wall surface of the planarizing layer facing the contact hole in the planarizing layer and the inner wall surface of the passivation layer facing the contact hole in the passivation layer.

In the manufacturing method pertaining to the above aspect, the contact hole in the passivation layer is formed by using a gas containing fluorine. Accordingly, after forming of the contact hole in the passivation layer in (iv-2) above, a liquid-repellent film containing fluorine is formed at least on the inner wall surface of the planarizing layer facing the contact hole in the planarizing layer. Because of this structure, even when moisture enters the contact holes in the planarizing layer and the passivation layer, the liquid-repellent film can prevent the inner wall surfaces facing the contact holes and the surface of an upper electrode or the like exposed at the bottom of the contact holes from becoming wet because of the moisture.

The manufacturing method pertaining to the above aspect can effectively prevent forming of an oxide film on the surface of an upper electrode or the like exposed at the bottom of the contact holes.

Accordingly, an active-matrix display panel that can achieve an excellent connection between the electrode of the TFT layer and the electrode of the display element unit can be manufactured while forming contact holes in two electrically-insulating layers (the passivation layer and the planarizing layer) disposed between these two electrodes.

Meanwhile, "a liquid-repellent film containing fluorine" in the above does not limit the present invention to aspects in which the liquid-repellent film is composed of a fluorine compound. Instead, "a liquid-repellent film containing fluorine" encompasses any liquid-repellent film containing fluorine.

In the method of manufacturing the active-matrix display panel pertaining to another aspect of the present invention, the liquid-repellent film is formed by continuing to expose the inner wall surface of the passivation layer to the gas after the contact hole in the passivation layer has been formed.

Continuing to expose the inner wall surfaces of the contact holes to a gas including fluorine (such as $CF_4$) after forming the contact hole in the passivation layer (such a continued exposure is hereinafter referred to as an overetching treatment) forms a liquid-repellent film on the inner wall surface of the passivation layer facing the contact hole in the passivation layer, in addition to the inner wall surface of the planarizing layer facing the contact hole in the planarizing layer. Accordingly, a liquid-repellent film can be formed without performing an additional process, and the effects described above can be achieved while maintaining low manufacturing cost.

Further, in the method of manufacturing the active-matrix display panel pertaining to another aspect the present invention, $$70\% \times T_0 \leq T_1 \leq 150\% \times T_0 \qquad \text{[Math 1]}$$

is satisfied, where $T_0$ denotes an amount of time from the start of the forming of the contact hole in the passivation layer to the completion of the forming of the contact hole in the passivation layer, and $T_1$ denotes an amount of time for which the inner wall surface of the passivation layer facing the contact hole in the passivation layer is exposed to the gas in order to form the liquid-repellent film.

Setting the time amount $T_1$ so as to satisfy Math 1 makes it possible to prevent a water drop from remaining in the contact holes, to prevent the surface of the upper electrode or the like from being oxidized, and to limit the thickness of the film containing fluorine that is to be disposed between the lower electrode and the upper electrode or the like. This assures an excellent connection between the lower electrode of the display element unit and the upper electrode or the like of the TFT layer.

In other words, in the method of manufacturing the active-matrix display panel pertaining to another aspect of the present invention, the forming of the liquid-repellent film produces an electrode coating film containing fluorine on the surface of the upper electrode or the like exposed at the bottom of the contact hole in the passivation layer, and an amount of time $T_1$ for which the inner wall surface of the passivation layer facing the contact hole in the passivation layer is exposed to the gas in order to form the liquid-repellent film is set such that a thickness of the electrode coating film does not exceed 3 nm. Due to this, an excellent connection between the lower electrode and the upper electrode or the like is assured.

In the method of manufacturing the active-matrix display panel pertaining to another aspect of the present invention, after the forming of the liquid-repellent film and before the forming of the lower electrode, the following processes are performed.

(iv-4) Surfaces of the planarizing layer and the passivation layer including regions thereof inside the contact holes are washed by using a washing liquid containing water.

(iv-5) Air or a gas is blown onto the surfaces of the planarizing layer and the passivation layer after the washing to remove any washing liquid remaining on the surfaces of the planarizing layer and the passivation layer.

In the manufacturing method pertaining to the present aspect, after forming the contact hole in the passivation layer in (iv-2) above and before the washing in (iv-4) above, a liquid-repellent film is formed on the inner wall surface of the passivation layer facing the contact hole as described in (iv-3) above. This assures that any washing liquid that has entered the contact holes in the planarizing layer and the passivation layer in (iv-4) above is removed from inside the contact holes by blowing air or the like in (iv-5) above. Accordingly, even in cases where washing by using a washing liquid is performed as in the present aspect, the washing liquid is not likely to remain in the contact holes after blowing air or the like in (iv-5) above, and forming of an oxide film on a surface of the upper electrode or the like exposed at the bottom of the contact holes is effectively prevented.

In the method of manufacturing the active-matrix display panel pertaining to another aspect of the present invention, the upper electrode or the like is made of copper (Cu) or a Cu alloy. This achieves low resistance of wiring and thus manufacture of a display panel having excellent displaying quality.

An active-matrix display panel pertaining to another aspect of the present invention includes a TFT layer, a planarizing layer, and a display element unit that are formed on a substrate in this order.

The TFT layer includes an electrode (hereinafter referred to as the upper electrode or the like) that is one of: (a) a source electrode; (b) a drain electrode; and (c) a connection electrode connected to the source electrode or the drain electrode; and a passivation layer that covers the upper electrode or the like and is in contact with the planarizing layer.

The display element unit includes a lower electrode that is in contact with the planarizing layer.

The lower electrode has a portion along inner wall surfaces of the planarizing layer and the passivation layer that face a contact hole so that the lower electrode electrically connects to the upper electrode or the like at the bottom of the contact hole, the contact hole continuously penetrating the passivation layer and the planarizing layer.

A film containing fluorine is disposed between the lower electrode and the inner wall surfaces, and an electrode coating film containing fluorine is disposed between the lower electrode and the upper electrode or the like at the bottom of the contact hole.

The active-matrix display panel manufactured through the manufacturing method pertaining to the above aspect has the structure described above. Accordingly, the active-matrix display panel having the above-described structure can achieve excellent displaying quality and an excellent connection between the lower electrode and the upper electrode or the like.

In the active-matrix display panel pertaining to another aspect of the present invention, a thickness of the electrode coating film is 3 nm or less. Setting the thickness of the electrode coating film to 3 nm or less (for example, 2 nm-3 nm) as described above can achieve an excellent connection between the lower electrode and the upper electrode or the like.

Embodiment

1. Method of Manufacturing Display Panel 10 and Display Device 1 Including Display Panel 10

The following describes a method of manufacturing a display panel 10 pertaining to an embodiment of the present invention and a display device 1 including the display panel 10, with reference to the drawings. In the following, for the sake of convenience, the method of manufacturing the display panel 10 is divided into three procedures: (1) a manufacturing procedure of a TFT layer, (2) a manufacturing procedure of a planarizing layer, and (3) a manufacturing procedure of a display element unit.

(1) Manufacturing Procedure of TFT Layer

First, the manufacturing procedure of a TFT layer is described with reference to FIG. 1, FIG. 2, and part (a) of FIG. 3.

A substrate 100 is prepared as illustrated in part (a) of FIG. 1.

As illustrated in part (b) of FIG. 1, at least one gate electrode 101 is formed on a main surface 100*a* of the substrate 100 which is an upper surface in a Z-axis direction, so that each gate electrode 101 corresponds one of at least one transistor element unit. The gate electrode 101 is formed through the following processes: disposing a metal film made of copper (Cu) and a metal film made of molybdenum (Mo) on the main surface 100*a* of the substrate 100 through metal sputtering, forming a resist pattern through photolithography on the metal films, and removing the resist pattern after wet-etching.

Although the attached drawings schematically illustrate only one transistor element unit, the display panel 10 includes a plurality of transistor element units.

A gate insulating layer 102 is disposed so as to cover the gate electrode 101 and an exposed portion of the main surface 100*a* of the substrate 100, as illustrated in part (c) of FIG. 1. The gate insulating layer 102 is formed by disposing a film of SiO and a film of SiN in this order through plasma chemical vapor deposition (CVD) or sputtering.

A channel layer 103 is formed on a region of the gate insulating layer 102 above the gate electrode 101, as illustrated in part (d) of FIG. 1. The channel layer 103 is formed by disposing a film of an oxide semiconductor through sputtering and patterning the film of the oxide semiconductor through photolithography and wet-etching.

A channel protection layer 1040 is disposed so as to cover the channel layer 103 and the gate insulating layer 102, as illustrated in part (e) of FIG. 1. The channel protection layer 1040 is formed by disposing a film of SiO through plasma CVD or sputtering and then performing annealing in a dry-air or oxygen atmosphere at a temperature higher than the temperature used when the film of SiO has been formed. Annealing is performed so as to repair an oxygen defect in the channel layer 103 and to maintain the semiconductor property.

A channel protection layer 104 is obtained by forming contact holes reaching the channel layer 103 in the channel protection layer 1040. Then, as illustrated in part (a) of FIG. 2, a source electrode 105 is formed so that a portion of the source electrode 105 is in contact with the channel layer 103 through a corresponding one of the contact holes. Also as illustrated in part (a) of FIG. 2, a drain electrode 106 is formed so that a portion of the drain electrode 106 is in contact with the channel layer 103 through a corresponding one of the contact holes. The contact holes in the channel protection layer 104 are formed through photolithography and dry-etching.

The source electrode 105 and the drain electrode 106 are formed by disposing a film of copper manganese (CuMn) and a film of molybdenum (Mo) through sputtering and by patterning the film of copper manganese (CuMn) and the film of molybdenum (Mo) through photolithography and wet-etching.

An interlayer electrically-insulating layer 1070 is formed so as to cover the source electrode 105, the drain electrode 106, and an exposed portion of the channel protection layer 104, as illustrated in part (b) of FIG. 2. The interlayer electrically-insulating layer 1070 is formed by performing plasma CVD or sputtering and then performing annealing in a dry-air or in oxygen atmosphere. Annealing is performed so as to maintain the semiconductor property of the channel layer 103, similarly to the annealing performed when forming the channel protection layer 1040.

An interlayer electrically-insulating layer 107 is obtained by forming a contact hole 107a in a portion of the interlayer electrically insulating layer 1070 above a portion of the source electrode 105, so that a portion of a surface 105a of the source electrode 105 is exposed at the bottom of the contact hole 107a, as illustrated in part (c) of FIG. 2. Next, an upper electrode 108 is formed on a portion of a surface of the interlayer electrically-insulating layer 107 including an inner wall surface of the interlayer electrically-insulating layer 107 facing the contact hole 107a, as illustrated in part (d) of FIG. 2.

The contact hole 107a in the interlayer electrically-insulating layer 107 is formed through dry-etching. The upper electrode 108 is formed by disposing a metal film through sputtering and then applying photolithography and wet-etching.

A passivation layer 1090 is formed so as to cover an exposed portion of the upper electrode 108 and the interlayer electrically-insulating layer 107, as illustrated in part (a) of FIG. 3. The passivation layer 1090 is formed through plasma CVD or sputtering.

The TFT layer is formed on the substrate 100 through the processes described above.

(2) Manufacturing Procedure of Planarizing Layer

The following describes how a planarizing layer is formed and how a contact hole is formed in the planarizing layer, with reference to part (b) and part (c) of FIG. 3 and part (a) and part (b) of FIG. 4.

A planarizing layer 1100 is disposed so as to cover the passivation layer 1090, as illustrated in part (b) of FIG. 3. The planarizing layer 1100 is formed by applying and curing an organic material and planarizing a main surface of the planarizing layer 1100 which is an upper surface in the Z-axis direction.

As illustrated in part (c) of FIG. 3, a planarizing layer 110 is obtained by forming a contact hole 110 in the planarizing layer 1100, and a passivation layer 109 is obtained by forming a contact hole 109a in the passivation layer 1090. The contact hole 110a and the contact hole 109a are formed so as to connect to each other. The contact hole 110a in the planarizing layer 110 is formed through lithography (exposure/development). The contact hole 109a in the passivation layer 109 is formed through dry-etching, and the dry-etching is continued so as to achieve forming of the contact hole 109a whose bottom exposes a portion of a surface 108a of the upper electrode 108.

A main surface of the planarizing layer 110 which is an upper surface in the Z-axis direction and insides of the contact holes 110a and 109a are washed by using pure water (water-washing), as illustrated in part (a) of FIG. 4. Meanwhile, the pure water, which is a washing liquid, also contacts a surface 108b of the upper electrode 108 in the water-washing.

After water-washing, the washing liquid is removed by blowing air onto the main surface of the planarizing layer 110, which is the upper surface in the Z-axis direction, and the insides of the contact holes 110a and 109a, as illustrated in part (b) of FIG. 4. When removing the washing liquid, an air nozzle is moved so that water drops on a surface 108c of the upper electrode 108 exposed at the bottom of the contact holes 110a and 109a are also removed.

(3) Manufacturing Procedure of Display Element Unit

Figure 6A:
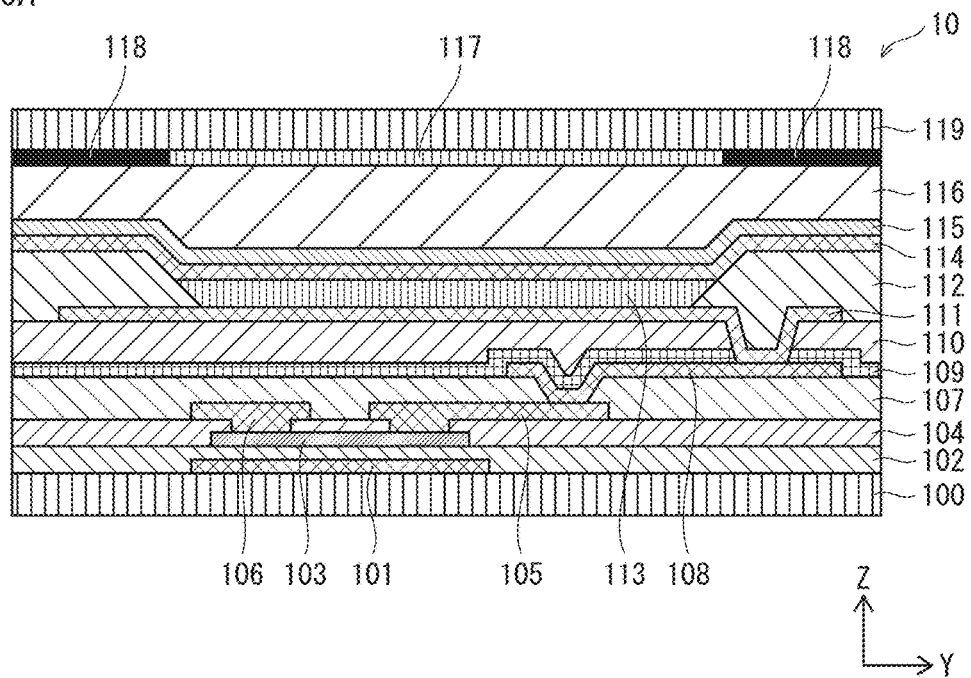
FIG. 6A is a schematic cross-sectional view illustrating a structure of the display panel 10 pertaining to the embodiment of the present invention after completion of manufacture.

The following describes how a display element unit is formed on the planarizing layer 110, with reference to part (c) of FIG. 4, FIG. 5, and FIG. 6A.

An anode 111 is formed so as to cover the planarizing layer 110 and the insides of the contact holes 110a and 109a, as illustrated in part (c) of FIG. 4. The anode 111 is formed by disposing a metal film through sputtering or vacuum vapor deposition and patterning the metal film through photolithography and etching. The present embodiment includes a plurality of anodes and display element units, and the patterning is performed so that the anodes 111 correspond one-to-one to the display elements units.

A hole injection layer, a hole transport layer, or the like may be formed on the anode 111, but description thereof is omitted.

As illustrated in part (a) of FIG. 5, banks 112 that define an opening 112a are formed at circumferential portions of a surface 111a of the anode 111. The present embodiment includes a plurality of openings 112a each defining a corresponding one of the display element units. The banks 112 are formed by disposing a film made of a material for the banks 112 on the anode 111 through spin coating or the like and forming the opening 112a through patterning. The opening 112a is formed in the banks 112 through performing exposing with a mask placed on the film made of the material for the banks 112 and then performing developing.

An organic light-emitting functional layer 113 including an organic light-emitting layer is formed in the opening 112a defined by the banks 112 as illustrated in part (b) of FIG. 5. Then, a cathode 114 and a sealing layer 115 are formed in this order on the organic light-emitting functional layer 113 and top surfaces of the banks 112, as illustrated in part (c) of FIG. 5. In part (c) of FIG. 5, the organic light-emitting functional layer 113 is illustrated as having a single-layered structure, but the organic light-emitting functional layer 113 may include a plurality of layers including the organic light-emitting layer. All the layers of the organic light-emitting functional layer 113 are formed through printing.

For example, the cathode 114 and the sealing layer 115 are formed through sputtering.

Finally, a color filter panel (CF panel) that has been formed separately is adhered with a resin layer 116 disposed between the CF panel and the sealing layer 115 as illustrated in FIG. 6A, and manufacture of the display panel 10, which is an active-matrix display panel, is completed. The CF panel is a panel formed by disposing a color filter layer 117 and a black matrix layer 118 on a main surface of a substrate 119 which is a lower surface in the Z-axis direction.

(4) Forming Display Device 1

Figure 6B:
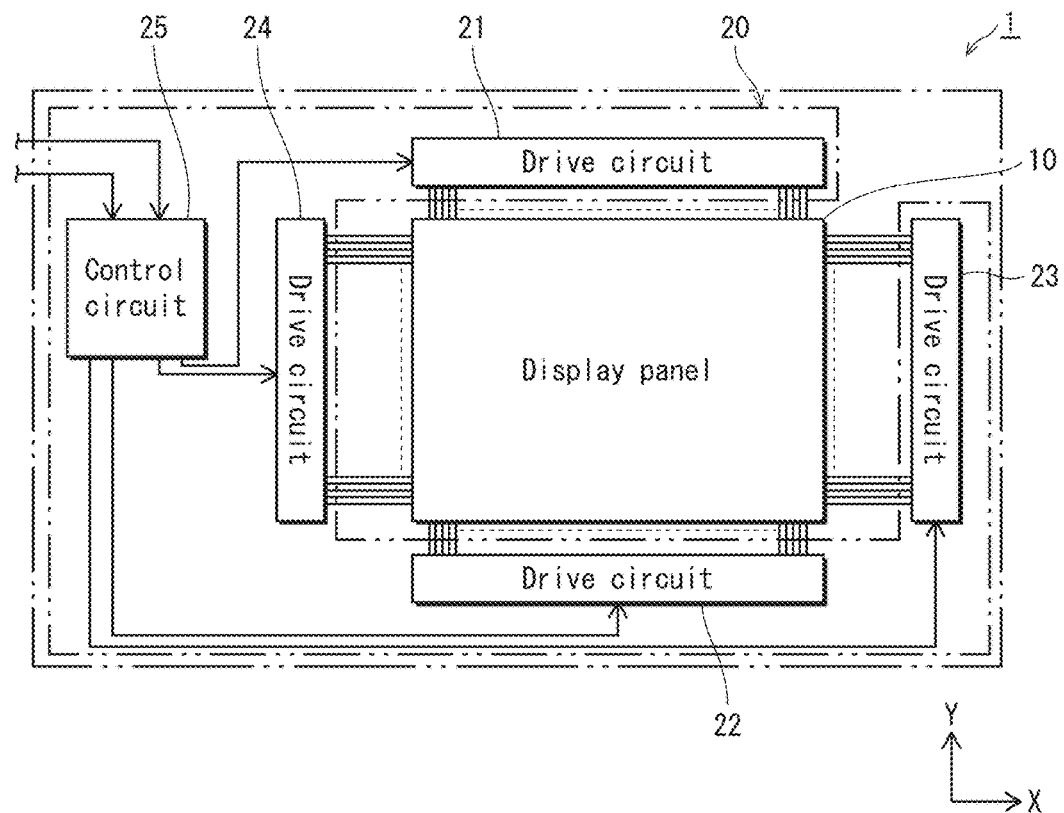
FIG. 6B is a schematic block diagram illustrating a structure of a display device 1 formed by using the display panel 10 pertaining to the embodiment of the present invention.

Next, as illustrated in FIG. 6B, a drive and control circuit unit 20 is connected to the display panel 10 formed through the above-described processes. This completes forming of the display device 1. For example, the drive and control circuit unit 20 includes four drive circuits 21-24 and a control circuit 25. Meanwhile, the structure of the drive and control circuit unit 20 is not limited to this. For example, the number of the drive circuits may be two. Further, arrangement of the drive circuits relative to the display panel 10 may be modified so that the four drive circuits or the two drive circuits are disposed along two circumferential edges of the display panel 10, or all the drive circuits are disposed along one circumferential edge of the display panel 10.

2. Materials for Each Component (1) Substrates 100 and 119

For example, the substrates 100 and 119 may be a glass substrate, a silica glass substrate, a silicon substrate, a metal substrate made of a metal such as molybdenum sulfide, copper, zinc, aluminum, stainless steel, magnesium, iron, nickel, gold, or silver, a semiconductor substrate made of a semiconductor such as gallium arsenide, or a plastic substrate.

The plastic substrate for the substrates 100 and 119 may be made of a thermoplastic resin or a thermosetting resin. For example, the plastic substrate may be made of a single layer of any of the following materials or a laminate of any two or more of the following materials: polyolefin such as polyethylene, polypropylene, ethylene-propylene copolymer, and ethylene-vinylacetate copolymer (EVA), cyclic polyolefin, modified polyolefin, polyvinyl chloride, polyvinylidene chloride, polystyrene, polyamide, polyimide (PI), polyamideimide, polycarbonate, poly-(4-methylpentene-1), ionomer, an acrylic resin, polymethyl methacrylate, acrylic-styrene copolymer (AS resin), butadiene-styrene copolymer, ethylene vinyl alcohol copolymer (EVOH), polyester such as polyethylene terephthalate (PET), polybutylene terephthalate, polyethylene naphthalate (PEN), and poly cyclohexane terephthalate (PCT), polyether, polyether ketone, polyether sulfone (PES), polyether imide, polyacetal, polyphenylene oxide, modified polyphenylene oxide, polyarylate, aromatic polyester (liquid crystal polymer), polytetrafluoroethylene, polyvinylidene fluoride, other fluororesin, thermoplastic elastomer such as styrenic elastomer, polyolefin elastomer, polyvinyl chloride elastomer, polyurethane elastomer, fluorine rubber elastomer, and chlorinated polyethylene elastomer, an epoxy resin, a phenol resin, an urea resin, a melamine resin, an unsaturated polyester, a silicone resin, polyurethane, or copolymer, blend, polymer alloy or the like mainly including such a material.

(2) Gate Electrode 101

For example, the gate electrode 101 includes copper (Cu). Specifically, a laminate of a layer made of copper (Cu) and a layer made of molybdenum (Mo) may be used.

Meanwhile, the structure of the gate electrode 101 is not limited to this. For example, the gate electrode 101 may be a single layer of copper (Cu) or a laminate of a layer made of copper (Cu) and a layer made of tungsten (W), or may be made of any of the following materials.

Aside from the above examples, the gate electrode 101 may be made of any of the following materials: a metal such as chromium (Cr), aluminum (Al), tantalum (Ta), niobium (Nb), silver (Ag), gold (Au), platinum (Pt), palladium (Pd), indium (In), nickel (Ni), or neodymium (Nd), or an alloy thereof, a conductive metal oxide such as zinc oxide, tin oxide, indium oxide, or gallium oxide, a conductive metal composite oxide such as indium tin oxide (ITO), indium zinc oxide (IZO), aluminum zinc oxide (AZO), or gallium zinc oxide (GZO), a conductive polymer such as polyaniline, polypyrrole, polythiophene, or polyacetylene, or any of the above with an added dopant such as an acid such as hydrochloric, sulfuric, or sulfonic acid, a Lewis acid such as hexafluoride phosphorus, arsenic pentafluoride, or iron chloride, a halogen atom such as iodine, or a metal atom such as sodium and potassium, or a conductive composite material in which carbon black or metal particles are dispersed. Further, a polymer mixture may be used that includes conductive particles such as fine metal particles and graphite. One, two, or more of the above may be combined.

(3) Gate Insulating Layer 102

For example, the gate insulating layer 102 is a laminate of silicon oxide (SiO) and silicon nitride (SiN). However, the structure of the gate insulating layer 102 is not limited to this. The gate insulating layer 102 may be made of, for example, any known organic material or inorganic material that has an electrically-insulating property.

As an organic material for the gate insulating layer 102, for example, an acrylic resin, a phenolic resin, a fluorine resin, an epoxy resin, an imide resin, or a novolac resin may be used.

Further, as an inorganic material for the gate insulating layer 102, for example, a metal oxide such as silicon oxide, aluminum oxide, tantalum oxide, zirconium oxide, cerium oxide, zinc oxide, or cobalt oxide, a metal nitride such as silicon nitride, aluminum nitride, zirconium nitride, cerium nitride, zinc nitride, cobalt nitride, titanium nitride, or tantalum nitride, or a metal composite oxide such as barium strontium titanate or zirconium titanate may be used. One, two, or more of the above may be combined.

Further, a surface of the gate insulating layer 102 may be treated by a surface treatment agent (such as ODTS, OTS, HMDS, βPTS), for example.

(4) Channel Layer 103

For example, the channel layer 103 is a layer made of amorphous indium gallium zinc oxide (IGZO). The material for the channel layer 103 is not limited to this example, and an oxide semiconductor including at least one material selected from indium (In), gallium (Ga), and zinc (Zn) may be used.

Further, the channel layer 103 may have a thickness in a range from 20 nm to 200 nm. The thicknesses of all the channel layers 103 are not necessarily the same, and the thicknesses of the channel layers 103 may be different from each other.

(5) Channel Protection Layer 104

For example, the channel protection layer 104 is a layer made of silicon oxide (SiO). The material for the channel protection layer 104 is not limited to this example, and silicon oxynitride (SiON), silicon nitride (SiN), or aluminum oxide ($AlO_x$) may be used, for example. Further, the channel protection layer 104 may have a plurality of layers each made of a different one of the above materials.

Further, the thickness of the channel protection layer 104 may be, for example, in a range from 50 nm to 500 nm.

(6) Source Electrode 105 and Drain Electrode 106

For the source electrode 105 and the drain electrode 106, a laminate of copper manganese (CuMn) and molybdenum (Mo) may be used.

For example, the thicknesses of the source electrode 105 and the drain electrode 106 may be in a range from 100 nm to 500 nm.

(7) Interlayer Electrically-Insulating Layer 107

For example, the interlayer electrically-insulating layer 107 is a layer made of silicon oxide (SiO).

(8) Upper Electrode 108

For example, the upper electrode 108 is a laminate of copper manganese (CuMn) and molybdenum (Mo), in a manner similar to the source electrode 105, the drain electrode 106, and the like. In the upper electrode 108, a layer containing copper (Cu) is disposed at an upper side of the upper electrode 108 in the Z-axis direction.

(9) Passivation Layer 109

For example, the passivation layer 109 is a layer made of silicon nitride (SiN).

For example, a thickness of the passivation layer 109 may be in a range from 50 nm to 150 nm, specifically, 100 nm.

(10) Planarizing Layer 110

For example, the planarizing layer 110 is a layer made of polyimide. Aside from a layer made of polyimide, the planarizing layer 110 may be a layer made of an organic compound such as polyamide and an acrylic resin.

Meanwhile, a thickness of the planarizing layer 110 may be in a range from 4.0 μm to 5.0 μm, for example, 4.5 μm.

(11) Anode 111

The anode 111 is made by using a metal material containing silver (Ag) or aluminum (Al). In the case of the display panel 10 pertaining to the present embodiment, which is a top-emission type display panel, surface portions of the anode 111 are preferably highly reflective.

The anode 111 is not restricted to a single-layer structure made of the above-described metal material, and may be a laminate of a metal layer and a light-transmissive electrically-conductive layer. For example, the light-transmissive electrically-conductive layer may be made of indium tin oxide (ITO) or indium zinc oxide (IZO).

Meanwhile, functional layers such as a hole injection layer disposed between the anode 111 and the organic light-emitting layer are neither illustrated nor described in the present embodiment. However, the present embodiment may have a structure including one or more of these functional layers.

For example, when a hole injection layer is provided, the hole injection layer may be made of a material such as an oxide of silver (Ag), molybdenum (Mo), chromium (Cr), vanadium (V), tungsten (W), nickel (Ni), iridium (Ir), or the like, or an electrically conductive polymer such as polyethylenedioxythiophene (PEDOT; mixture of polythiophene and polystyrene sulfonic acid).

Meanwhile, a hole injection layer made of a metal oxide is effective in that such a hole injection layer has a greater function of injecting holes to the organic light-emitting layer by stabilizing holes or assisting in generation of holes, and has a higher work function compared to a hole injection layer made of an electrically conductive polymer such as PEDOT.

(12) Banks 112

The banks 112 are made by using an organic material such as a resin and have an electrically-insulating property. Examples of an organic material that may be used in forming the banks 112 are an acrylic resin, a polyimide resin, and a novolac-type phenolic resin. The banks 112 preferably have organic solvent resistance. Further, during the manufacturing processes, the banks 112 may be subjected to etching, baking, or the like, and therefore the banks 112 are preferably formed from a material having a high resistance to deformation, deterioration, or the like, during such processes. Further, in order to impart water repellency to surfaces of the banks 112, the surfaces may be fluorine-treated.

This is because, in a case of the banks 112 being formed using a lyophilic material, a difference in lyophilicity/liquid repellency of surfaces of the banks 112 and surfaces of the organic light-emitting layer would become small, and it would become difficult to selectively retain an ink including an organic material for forming the light-emitting layer in the opening 112a, which is defined by the banks 112.

Further, the structure of the banks 112 is not limited to the single-layer structure illustrated in FIG. 6A, and may be a multi-layered structure having two or more layers. In such a case, each of the two or more layers of the banks 112 may be made of a different one of the materials above, or the two or more layers may be a combination of one or more layers made of an inorganic material and one or more layers made of an organic material.

(13) Organic Light-Emitting Functional Layer 113

The organic light-emitting layer in the organic light-emitting functional layer 113 has a function of emitting light by recombining holes and electrons injected thereto and generating an excited state. As a material used in forming the organic light-emitting layer, it is necessary to use an organic light-emitting material that can be formed into a film through wet printing.

Specifically, it is preferable that the organic light-emitting layer be made of, for example, a fluorescent material such as an oxinoid compound, a perylene compound, a coumarin compound, an azacoumarin compound, an oxazole compound, an oxadiazole compound, a perinone compound, a pyrrolo-pyrrole compound, a naphthalene compound, an anthracene compound, a fluorene compound, a fluoranthene compound, a tetracene compound, a pyrene compound, a coronene compound, a quinolone compound and an azaquinolone compound, a pyrazoline derivative and a pyrazolone derivative, a rhodamine compound, a chrysene compound, a phenanthrene compound, a cyclopentadiene compound, a stilbene compound, a diphenylquinone compound, a styryl compound, a butadiene compound, a dicyanomethylene pyran compound, a dicyanomethylene thiopyran compound, a fluorescein compound, a pyrylium compound, a thiapyrylium compound, a selenapyrylium compound, a telluropyrylium compound, an aromatic aldadiene compound, an oligophenylene compound, a thioxanthene compound, a cyanine compound, an acridine compound, a metal complex of an 8-hydroxyquinoline compound, a metal complex of a 2-bipyridine compound, a complex of a Schiff base and a group III metal, a metal complex of oxine, or a rare earth metal complex, as described in Japanese Patent Application Publication No. H5-163488.

Further, an electron transport layer may be disposed between the organic light-emitting layer and the cathode 114.

The electron transport layer has a function of transporting electrons injected from the cathode 114 to the light-emitting layer, and is formed by using, for example, an oxadiazole derivative (OXD), a triazole derivative (TAZ), or a phenanthroline derivative (BCP, Bphen).

(14) Cathode 114

For example, the cathode 114 is formed by using indium tin oxide (ITO) or indium zinc oxide (IZO). In the case of the display panel 10 pertaining to present embodiment, which is a top-emission type display panel, it is necessary to form the cathode 114 from a light-transmissive material. It is preferable that the light transmittance of such a light-transmissive material be 80% or greater.

(15) Sealing Layer 115

The sealing layer 115 has a function of preventing exposure of organic layers such as the organic light-emitting layer to moisture and air, and may be made by using a material such as silicon nitride (SiN) or silicon oxynitride (SiON). Further, the sealing layer 115 may include a sealing resin layer that is made of a resin such as an acrylic resin or a silicone resin and is disposed on a layer formed from a material such as silicon nitride (SiN) or silicon oxynitride (SiON).

In the case of the display panel 10 pertaining to present embodiment, which is a top-emission type display panel, it is necessary to form the sealing layer 115 formed from a light-transmissive material.

(16) Color Filter Layer 117

The present embodiment includes a plurality of color filter layers 117 each made by using a known material selectively transmitting visible light of wavelength regions corresponding to one of the colors red (R), green (G), blue (B). For example, the color filter layers 117 mainly contain an acrylic resin.

(17) Black Matrix Layer 118

For example, the black matrix layer 118 is made by using an ultraviolet curing resin containing a black pigment having a high light-absorbing and light-shielding property. A specific example of such an ultraviolet curing resin is an acrylic resin.

3. Forming of Contact Holes 110a and 109a

Figure 7:
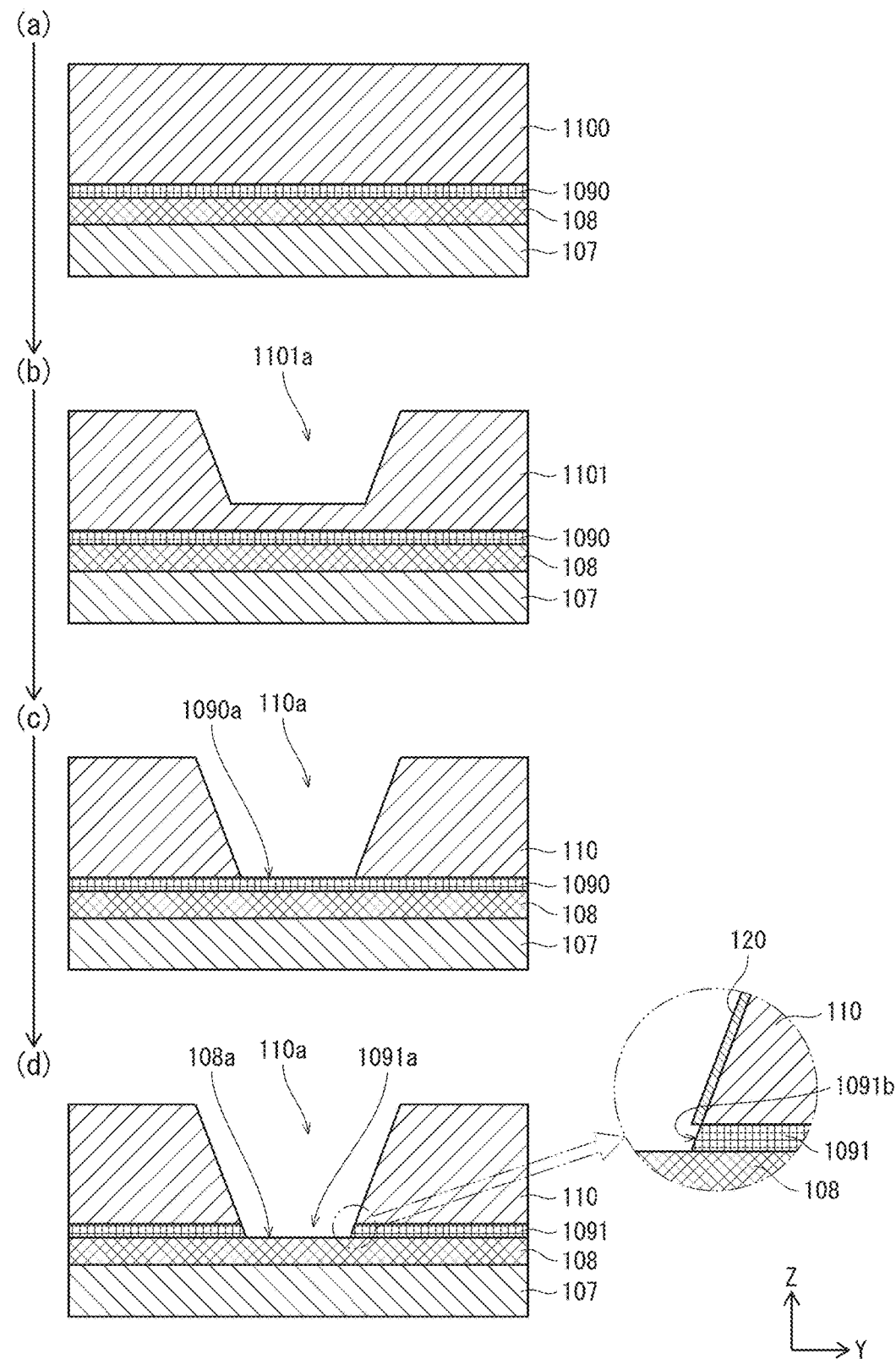
FIG. 7 includes parts (a)-(d) that are schematic cross-sectional views sequentially illustrating processes pertaining to a practical example of forming contact holes in a passivation layer 1090 and a planarizing layer 1100.
Figure 9:
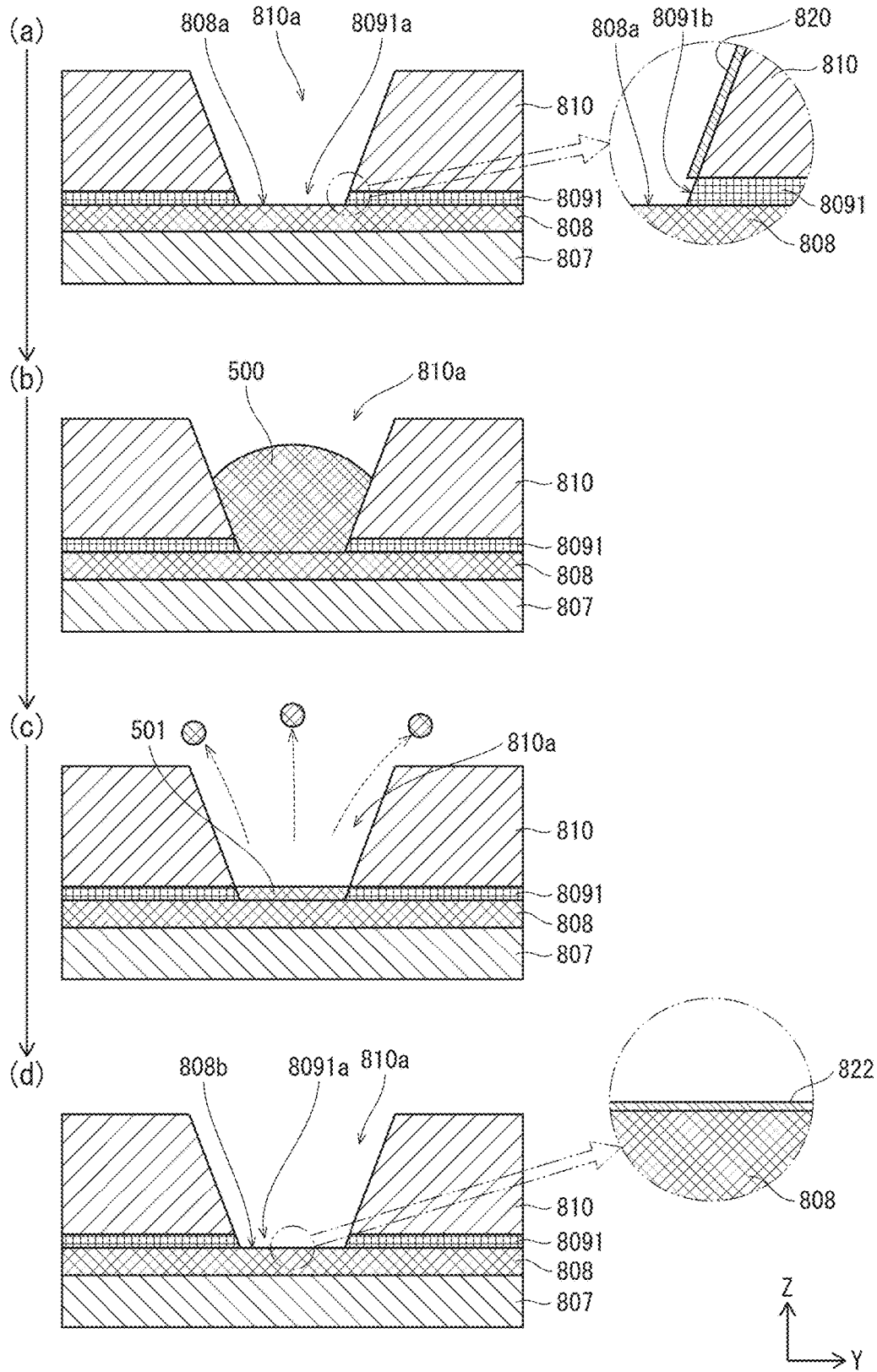
FIG. 9 includes parts (a)-(d) that are schematic cross-sectional views sequentially illustrating processes in a comparative example of forming contact holes.

Next, among the manufacturing processes described above, processes of forming the contact holes 110a and 109a in the planarizing layer 110 and the passivation layer 109 are described in detail, with reference to FIG. 7 through FIG. 9.

Parts (a)-(d) of FIG. 7 and parts (a)-(c) of FIG. 8 are schematic cross-sectional views illustrating in detail processes of manufacturing a practical example pertaining to the embodiment of the present invention described above, corresponding to the manufacturing processes illustrated in parts (b)-(c) of FIG. 3 and parts (a)-(b) of FIG. 4. Parts (a)-(d) of FIG. 9 illustrate schematic cross-sectional views illustrating processes of manufacturing the comparative example, corresponding to the manufacturing processes of the practical example.

Practical Example

In the manufacturing processes of the display panel 10, the interlayer electrically-insulating layer 107, the upper electrode 108, the passivation layer 1090, and the planarizing layer 1100 are formed in this order from a lower side of the display panel 10 in the Z-axis direction, as illustrated in part (a) of FIG. 7. In the present practical example, a thickness of the passivation layer 1090 is 100 nm, and a thickness of the planarizing layer 1100 is 4.5 µm.

The passivation layer 1090 is made of SiN, and the planarizing layer 1100 is made of polyimide. The upper electrode 108 is a laminate in which a layer of molybdenum (Mo) and a layer of copper manganese (CuMn) are disposed in this order from a lower side of the upper electrode 108 in the Z-axis direction.

Next, forming of a contact hole 1101a is performed starting from a surface of the planarizing layer 1101 through lithography, as illustrated in part (b) of FIG. 7.

The lithography for forming the contact hole 1101a in the planarizing layer 1101 is continued until a surface 1090a of the passivation layer 1090 is exposed at the bottom of the contact hole 1101a. This achieves completion of forming of the contact hole 110a and the planarizing layer 110, as illustrated in part (c) of FIG. 7.

Next, a contact hole 1091a is formed by dry-etching a passivation layer 1091 while using the planarizing layer 110, in which the contact hole 110a has been formed, as a mask, as illustrated in part (d) of FIG. 7. Conditions for the dry-etching are as in the following:

$CF_4/O_2 = 1080/120$ [sccm]

Pressure=15-50 [mTorr] (for example, 30 [mTorr])

Source,Bias=3000 [W]

The unit (sccm) of gas flow rate in the above condition indicates a value at a temperature of 0° C. and 1013 hPa (1 atm).

As a result of the dry-etching, the surface 108a of the upper electrode 108 is exposed at the bottom of the contact hole 1091a in the passivation layer 1091. Here, as illustrated in a portion of part (d) of FIG. 7 surrounded by a two-dot-dash line, almost no fluorine film is formed on an inner wall surface 1091a of the passivation layer 1091 facing the contact hole 1091a. Meanwhile, a fluorine film 120 is formed on side walls of the planarizing layer 110 facing the contact hole 110a.

Meanwhile, aspect ratio of the contact holes 110a and 109a is substantially 100% in the present practical example.

In the manufacturing method pertaining to the present practical example, an over-etching treatment is performed after the contact hole 1091a has been formed in the passivation layer 1091, and the contact hole 109a is obtained. Through this process, inner wall surfaces of the planarizing layer 110 and the passivation layer 109 facing the contact holes 110a and 109a are covered by a fluorine film 121, as illustrated in a portion of part (a) of FIG. 8 surrounded by a two-dot-dash line. A surface of the upper electrode 108 that is exposed at the bottom of the contact hole 109a is also covered by the fluorine film 121 (that is, an electrode coating film containing fluorine is formed).

Meanwhile, "a fluorine film" in this description simply indicates "a film containing fluorine", and is not necessarily limited to a film containing a compound of fluorine.

The present inventor, in cooperation with one or more others, conducted investigations with regard to an amount of time for which the over-etching treatment is to be performed and revealed the following: when $T_0$ denotes an amount of time from when etching is started as illustrated in part (c) of FIG. 7 to when exposing of the surface 108a of the upper electrode 108 is achieved as illustrated in part (d) of FIG. 7, and $T_1$ denotes an amount of time from when the state illustrated in part (d) of FIG. 7 is achieved to when the state illustrated in part (a) of FIG. 8 is achieved, it is preferable that the time amount $T_1$ satisfy the following expression.

$$70\% \times T_0 \leq T_1 \leq 150\% \times T_0 \qquad \text{[Math 2]}$$

For example, when supposing that the time amount $T_0$ is 35 sec, the time amount $T_1$ is in a range from 24.5 sec to 87.5 sec.

Meanwhile, the time amount $T_1$ described above can vary in accordance with factors such as conditions for the dry-etching, materials for the layers, or the like. Accordingly, it is preferable that $T_1$ be determined in accordance with such factors.

Next, washing by using pure water or the like is performed after the dry-etching, as illustrated in part (b) of FIG. 8. At this point, a water drop 500 may enter the contact holes 110a and 109a.

In the manufacturing method pertaining to the present practical example, even when the water drop 500 enters the contact holes 110a and 109a, the water drop 500 can be removed by blowing air as illustrated in part (b) of FIG. 8. This is because the inner wall surfaces of the planarizing layer 110 and the passivation layer 109 facing the contact holes 110a and 109a are covered by the fluorine film 121 as illustrated in part (a) of FIG. 8 as a result of the over-etching treatment. Water drops thus can be prevented from remaining on the surface 108c of the upper electrode 108 exposed at the bottom of the contact holes 110a and 109a in the manufacturing method pertaining to the present practical example.

Accordingly, the manufacturing method pertaining to the present practical example can prevent forming of a metal oxide film on the surface 108c of the upper electrode 108 and assure an excellent connection to the anode 111.

Comparative Example

In the comparative example, an interlayer electrically-insulating layer 807 and an upper electrode 808 are disposed in this order, and contact holes 810a and 8091a are formed in a planarizing layer 810 and a passivation layer 8091 that are disposed on the interlayer electrically-insulating layer 807 and the upper electrode 808, as illustrated in part (a) of FIG. 9. In the comparative example, the contact hole 810a is formed in the planarizing layer 810 through lithography, and the contact hole 8091a is formed in the passivation layer 8091 through dry-etching, similarly to the practical example.

In the manufacturing method pertaining to the comparative example, etching is terminated when a surface 808a of the upper electrode 808 is exposed at the bottom of the contact holes 810a and 8091a. At the time point of the end of etching, an inner wall surface of the planarizing layer 810 facing the contact hole 810a is covered by a fluorine film 820, but almost no fluorine film is formed on an inner wall surface of the passivation layer 8091 facing the contact hole 8091a, as illustrated in a portion of part (a) of FIG. 9 surrounded by a two-dot-dash line.

Next, washing by using pure water or the like is performed, as illustrated in part (b) of FIG. 9. At this point, a water drop 500 may enter the contact holes 810a and 8091a, in a manner similar to the practical example described above.

Next, blowing air is performed so as to remove the water drop 500, as illustrated in part (c) of FIG. 9. Here, a water drop portion 501 which is a portion of the water drop 500 may remain at a bottom portion of the contact hole 8091a. This is due to the fact that the inner wall surface of the passivation layer 8091 facing the contact hole 8091a is not covered by a fluorine film, as illustrated in the portion of part (a) of FIG. 9 surrounded by the two-dot-dash line. That is, the inner wall surface of the passivation layer 8091 facing the contact hole 8091a has low water repellency, and the water drop portion 501, which has entered the bottom portion of the contact hole 8091a, cannot be removed easily.

In a state in which the water drop 500 in the contact hole 8091a is not removed completely and the water drop portion 501 is remaining (that is, the contact hole 8091a is in a wet state) as described above, a surface of the upper electrode 808 at the bottom of the contact holes 810a and 8091a is covered by a metal oxide film 822, as illustrated in part (d) of FIG. 9. Accordingly, the manufacturing method pertaining to the comparative example cannot assure an excellent connection between the upper electrode 808 and an anode.

4. Surroundings of Contact Holes

Surroundings of contact holes in a case where the contact holes are formed through the manufacturing method pertaining to the practical example described above and surroundings of contact holes in a case where the contact holes are formed through the manufacturing method pertaining to the comparative example are described in the following.

Practical Example

Figure 10B:
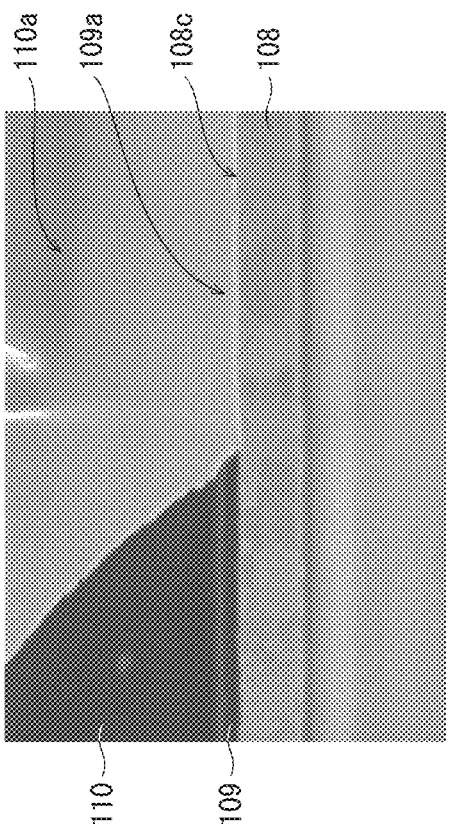
FIG. 10B is an image representing a cross-section of the contact holes formed through the manufacturing method pertaining to the practical example and the surroundings of the contact holes.
Figure 10D:
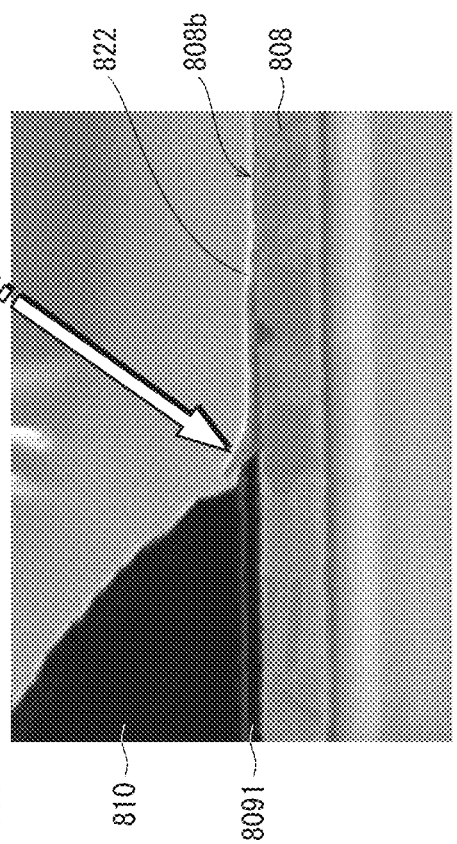
FIG. 10D is an image representing a cross-section of the contact holes formed through the manufacturing method pertaining to the comparative example and the surroundings of the contact holes.
Figure 10A:
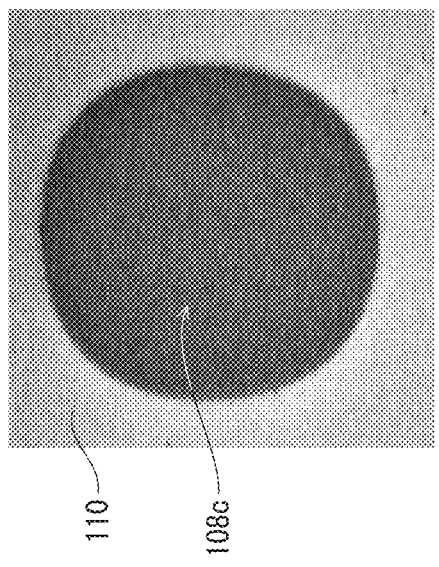
FIG. 10A is an image representing a plan view of a contact hole formed through a manufacturing method pertaining to the practical example and surroundings of the contact holes.

In a case where the contact holes are formed through the manufacturing method pertaining to the practical example, the surface 108c of the upper electrode 108 exposed at the bottom of the contact holes is not covered by a metal oxide film, as illustrated in FIG. 10A. This can also be seen in the cross-section in FIG. 10B, in which the surface 108c of the upper electrode 108 is exposed at the bottom of the contact holes 110a and 109a and is not covered by a metal oxide film.

Comparative Example

Figure 10C:
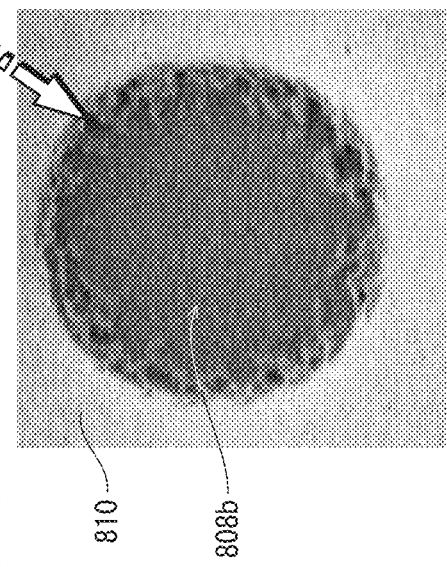
FIG. 10C is an image representing a plan view of contact holes formed through a manufacturing method pertaining to the comparative example and surroundings of the contact holes.

Meanwhile, in a case where the contact holes are formed through the manufacturing method pertaining to the comparative example, a metal oxide film ($CuO_X$ film) is formed on a portion (a portion close to an inner rim of the contact holes) of a surface 808b of the upper electrode 808 exposed at the bottom of the contact holes, as illustrated in FIG. 10C. This can also be seen in the cross-section in FIG. 10D, in which a metal oxide film ($CuO_X$ film) 822 is formed so as to cover a portion of the surface 808b of the upper electrode 808 at the bottom of the contact holes.

As the above-described results indicate, the manufacturing method pertaining to the practical example can assure an excellent connection between the upper electrode 108 and the anode 111.

5. Covering of Surface of Upper Electrode 108 by Fluorine Film 121

As described above, in the manufacturing method pertaining to the above embodiment, a surface of the upper electrode 108 is also covered by the fluorine film 121 (see the portion of part (a) of FIG. 8 surrounded by the two-dot-dash line) as a result of performing the over-etching treatment during processes of forming the contact hole 109a. A consideration of the fluorine film 121 is made in the following from the perspective of connection between the upper electrode 108 and the anode 111.

First, at the bottom of the contact hole 109a, $CuF_2$, CuFOH, or the like is considered to be formed on the surface 108a of the upper electrode 108 as illustrated in FIG. 11.

Figure 12A:
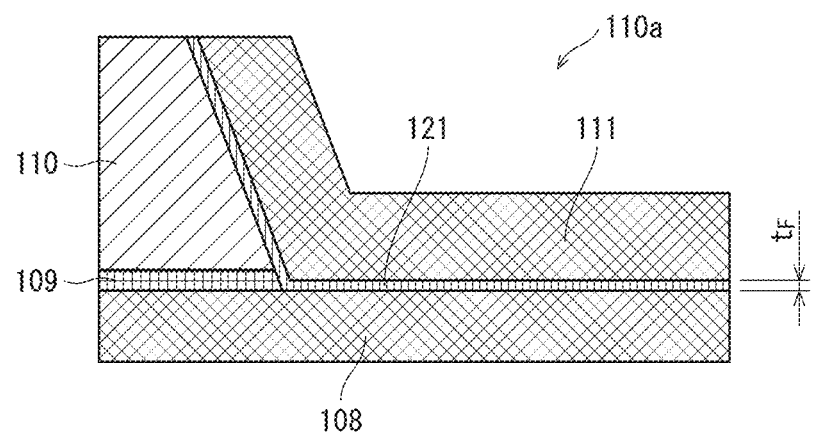
FIG. 12A is a schematic cross-sectional view illustrating surroundings of contact holes formed under conditions pertaining to the embodiment of the present invention.

Next, when a thickness $t_F$ of the fluorine film 121, which is disposed between the upper electrode 108 and the anode 111 at the bottom of the contact hole 109a, is 3 nm or less (for example, 2-3 nm) as illustrated in FIG. 12A, no problem is considered to arise in assuring an excellent connection between the upper electrode 108 and the anode 111. In other words, it is preferable that the time amount $T_1$ for which the over-etching treatment is performed be set so that thickness $t_F$ does not exceed 3 nm.

Figure 12B:
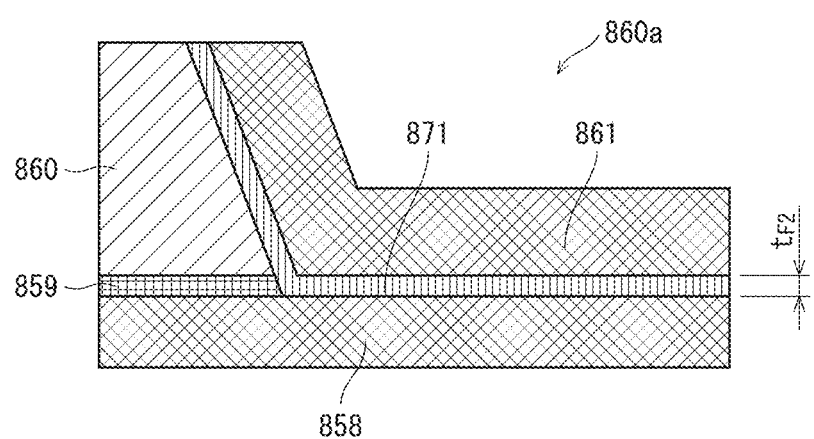
FIG. 12B is a schematic cross-sectional view illustrating surroundings of contact holes formed under conditions pertaining to the comparative example.

Meanwhile, when the amount of time for which the over-etching treatment is performed is too long, a fluorine film 871 covering an inner wall surface of a planarizing layer 860 and a passivation layer 859 facing a contact hole 860a becomes too thick, as illustrated in FIG. 12B. This is preferable from the perspective of preventing forming of a metal oxide film on a surface of an upper electrode 858.

However, a satisfactory connection between the upper electrode 858 and the anode 861 is prevented because of the fluorine film 871 between the upper electrode 858 and an anode 861 when thickness $t_{F2}$ of the fluorine film 871 exceeds 3 nm as illustrated in FIG. 12B.

From the above, it is preferable that the time amount $T_1$, which is the amount of time for which the over-etching treatment is performed, be set so that thickness $t_F$ of the fluorine film 121 formed on the upper electrode 108 does not exceed 3 nm.

[Modification]

Figure 13:
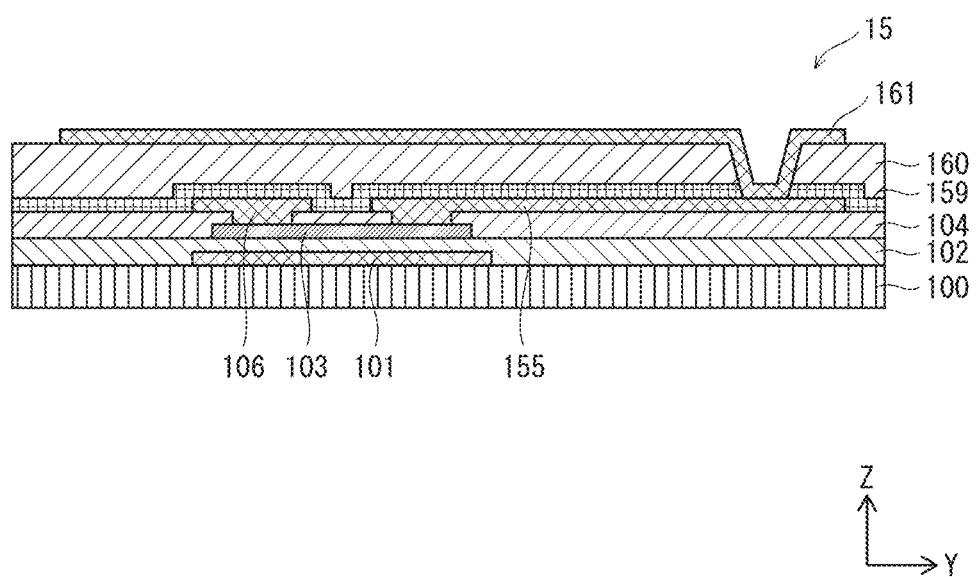
FIG. 13 is a schematic cross-sectional view illustrating a partial structure of a display panel 15 pertaining to a modification.

A structure of a display panel 15 pertaining to a modification is described with reference to FIG. 13. FIG. 13 illustrates a partial structure of the display panel 15. Note that components that appear in the embodiment described above are indicated by using the same reference signs in FIG. 13.

In the display panel 15, a passivation layer 159 and a planarizing layer 160 are disposed so as to cover an upper portion of a source electrode 155 and an upper portion of the drain electrode 106 of a TFT layer, as illustrated in FIG. 13. That is, the source electrode 155 and an anode 161 are directly connected without an upper electrode disposed therebetween in the present modification.

In manufacturing processes of the display panel 15 pertaining to the present modification, the passivation layer 159 and the planarizing layer 160 are formed, contact holes exposing a portion of an upper surface of the source electrode 155 are formed, and then the anode 161 is formed. When forming the contact holes, the over-etching treatment is performed in a manner similar to the embodiment described above so that a fluorine film covers inner wall surfaces of the passivation layer 159 and the planarizing layer 160 facing the contact holes. This process can prevent forming of a metal oxide film on a surface of the source electrode 155 exposed at the bottom of the contact hole in the passivation layer 159.

Accordingly, the present modification can assure an excellent connection between the source electrode 155 and the anode 161, similarly to the above embodiment.

[Other Issues]

The passivation layer 109 in the above embodiment and the passivation layer 159 in the above modification are made of SiN, but the present invention should not be construed as being limited to this. A layer made of a material which can be dry-etched by using a fluorine-based gas may be used. Further, a passivation layer may be a stack of a plurality of layers.

Further, the electrodes in the above embodiment and modification are made of a metal material containing copper (Cu), but materials for electrodes usable in the present invention should not be construed as being limited to this. Aluminum (Al), molybdenum (Mo), tungsten (W), titanium (Ti), or the like may be used aside from copper (Cu). In these cases as well, it is preferable that a manufacturing method similar to the above-described embodiment and modification be used in order to prevent forming of a metal oxide film.

Further, pure water is used in washing performed after forming of the contact hole 110a and the contact hole 109a in the above embodiment and the contact holes in the above modification, but the present invention should not be construed as being limited to this. A washing liquid containing water may be used. Meanwhile, when the planarizing layer 110 in the embodiment or the planarizing layer 160 in the modification is formed by a resin such as polyimide, it is preferable that usage of an organic washing liquid be avoided so as to prevent the planarizing layer 110 in the embodiment or the planarizing layer 160 in the modification from being affected by the organic washing liquid when performing washing.

Further, the display element unit has a structure in which the anode 111 in the above embodiment and the anode 161 in the above modification are disposed at a display element unit side of the TFT layer, and the cathode 114 is disposed at an upper side of the display element unit with the organic light-emitting functional layer 113 sandwiched between the cathode 114 and the anode 111 or 161. However, the positions of the anode and the cathode may be reversed.

Further, an organic EL display panel is used as an example of the display panel 10 in the above embodiment and the display panel 15 in the above modification, but the present invention should not be construed as being limited to this. For example, an inorganic EL display panel, a field emission (FE) display panel, and further a liquid crystal (LC) display panel may be used.

Further, in the above embodiment and modification, a relative velocity (a velocity of the air nozzle relative to the substrate) from 30 mm/sec to 70 mm/sec is used as an example when blowing the dry air. Conditions for blowing air such as conditions of temperature are considered as not having a great effect in achieving the advantageous effects of the present invention.

Further, in the above embodiment and modification, washing and blowing air are performed to the contact holes, but they are not essential requirements. Even when washing is not performed, moisture in the structure, in the environment, or the like may adhere onto components such as the inner wall surfaces facing the contact holes and the upper electrode exposed at the bottom of the contact holes. The manufacturing method pertaining to the present invention can effectively prevent forming of an oxide film on the surface of the upper electrode caused by such moisture and assure an excellent connection between the upper electrode of the TFT layer and the anode of the display element unit.

Further, the source electrode 155 and the anode 161 are connected in the above modification, but a structure in which the drain electrode 106 and an anode are connected may be used depending upon device structure.

Further, the inner wall surface in the passivation layer 109 facing the contact hole 109a in the above embodiment and the inner wall surface in the passivation layer 159 facing the contact hole in the passivation layer 159 in the above modification are covered by the fluorine film 121 formed through the over-etching treatment, but the present invention should not be construed as limiting how the fluorine film is formed to this. For example, a process of filling a fluorine-based gas in the contact holes 110a and 109a may be performed separately from dry-etching. However, forming the fluorine film 121 by performing the over-etching treatment as in the above embodiment and modification excels in efficiency in manufacture because no additional manufacturing process is required.

Further, the contact hole 110a in the planarizing layer 110 in the above embodiment and the contact hole in the planarizing layer 160 in the above modification are formed through lithography. However, the present invention should not be construed as being limited to this, and the contact hole in the planarizing layer may be formed by dry-etching or wet-etching, for example.

INDUSTRIAL APPLICABILITY

The present invention is usable in realizing an active-matrix display device having excellent displaying quality.

REFERENCE SIGNS LIST 1 display device
10, 15 display panel
20 drive/control circuit unit
21-24 drive circuit
25 control circuit
100, 119 substrate
101 gate electrode
102 gate insulating layer
103 channel layer
104, 1040 channel protection layer
105, 155 source electrode
106 drain electrode
107, 1070 interlayer electrically-insulating layer
108 upper electrode
109, 159, 1090, 1091 passivation layer
109a contact hole
110, 160, 1100 planarizing layer
110a contact hole
111, 161 anode
112 bank
113 organic light-emitting functional layer
114 cathode
115 sealing layer
116 resin layer
117 color filter layer
118 black matrix layer
120, 121 fluorine film
500 water drop

The invention claimed is:

1. A method of manufacturing an active-matrix display panel, comprising:
forming a thin film transistor (TFT) layer on a substrate;
forming a planarizing layer on the TFT layer; and
forming a display element unit on the planarizing layer, wherein
the forming of the TFT layer includes forming a passivation layer that covers one electrode and that comes into contact with the planarizing layer after forming of the planarizing layer, the one electrode being one of: (i) a source electrode; (ii) a drain electrode; and (iii) a connection electrode connected to the source electrode or the drain electrode,
the forming of the display element unit includes forming a lower electrode that is in contact with the planarizing layer and connects to the one electrode,
connecting the one electrode and the lower electrode involves:
forming, in the planarizing layer, a contact hole that exposes a surface of the passivation layer at the bottom thereof;
forming, in the passivation layer, a contact hole that connects to the contact hole in the planarizing layer and exposes the one electrode at the bottom thereof, through dry-etching the passivation layer exposed at the bottom of the contact hole in the planarizing layer by using a gas containing fluorine;
after forming the contact hole in the passivation layer, forming a liquid-repellent film containing fluorine on an inner wall surface of the passivation layer facing the contact hole in the passivation layer; and
forming the lower electrode along an inner wall surface of the planarizing layer facing the contact hole in the planarizing layer and the inner wall surface of the passivation layer facing the contact hole in the passivation layer.

2. The method of claim 1, wherein
the liquid-repellent film is formed by continuing to expose the inner wall surface of the passivation layer to the gas after the contact hole in the passivation layer has been formed.

3. The method of claim 2, wherein $$70\% \times T_0 \leq T_1 \leq 150\% \times T_0$$

is satisfied, where $T_0$ denotes an amount of time from the start of the forming of the contact hole in the passivation layer to the completion of the forming of the contact hole in the passivation layer, and
$T_1$ denotes an amount of time for which the inner wall surface of the passivation layer facing the contact hole in the passivation layer is exposed to the gas in order to form the liquid-repellent film.

4. The method of claim 2, wherein
the forming of the liquid-repellent film produces an electrode coating film containing fluorine on the surface of the one electrode exposed at the bottom of the contact hole in the passivation layer, and
an amount of time $T_1$ for which the inner wall surface of the passivation layer facing the contact hole in the passivation layer is exposed to the gas in order to form the liquid-repellent film is set such that a thickness of the electrode coating film does not exceed 3 nm.

5. The method of claim 1, wherein
after the forming of the liquid-repellent film and before the forming of the lower electrode,
surfaces of the planarizing layer and the passivation layer including regions thereof inside the contact holes are washed by using a washing liquid containing water,
air or a gas is blown onto the surfaces of the planarizing layer and the passivation layer after the washing to remove any washing liquid remaining on the surfaces of the planarizing layer and the passivation layer.

6. The method of claim 1, wherein
the one electrode is made of copper or a copper alloy.

7. An active-matrix display panel comprising a TFT layer, a planarizing layer, and a display element unit that are formed on a substrate in this order, wherein
the TFT layer includes:
an electrode that is one of: (i) a source electrode; (ii) a drain electrode; and (iii) a connection electrode connected to the source electrode or the drain electrode; and
a passivation layer that covers the electrode and is in contact with the planarizing layer,
the display element unit includes a lower electrode that is in contact with the planarizing layer,
the lower electrode has a portion along inner wall surfaces of the planarizing layer and the passivation layer that face a contact hole so that the lower electrode electrically connects to the electrode at the bottom of the contact hole, the contact hole continuously penetrating the passivation layer and the planarizing layer,
a film containing fluorine is disposed between the lower electrode and the inner wall surfaces, and
an electrode coating film containing fluorine is disposed between the lower electrode and the electrode at the bottom of the contact hole.

8. The active-matrix display panel of claim 7, wherein a thickness of the electrode coating film is 3 nm or less.

* * * * *